United States Patent
Viegas

(10) Patent No.: US 10,267,833 B2
(45) Date of Patent: Apr. 23, 2019

(54) POWER MONITORING PROBE FOR MONITORING POWER DISTRIBUTION IN AN ELECTRICAL SYSTEM

(71) Applicant: Equinix, Inc., Redwood City, CA (US)

(72) Inventor: Alvito Joseph Viegas, Gilroy, CA (US)

(73) Assignee: Equinix, Inc., Redwood City, CA (US)

( * ) Notice: Subject to any disclaimer, the term of this patent is extended or adjusted under 35 U.S.C. 154(b) by 188 days.

(21) Appl. No.: 15/341,504

(22) Filed: Nov. 2, 2016

(65) Prior Publication Data
US 2018/0120362 A1 May 3, 2018

(51) Int. Cl.
G01R 21/133 (2006.01)
G01R 15/18 (2006.01)
G01R 15/20 (2006.01)

(52) U.S. Cl.
CPC .......... *G01R 21/133* (2013.01); *G01R 15/18* (2013.01); *G01R 15/20* (2013.01); *G01R 15/207* (2013.01)

(58) Field of Classification Search
CPC .......... G06K 7/10465; G06K 7/10356; G06K 7/10336; G06K 7/10346; G01N 27/72
USPC ...................... 324/200, 207.3, 244, 253, 254
See application file for complete search history.

(56) References Cited

U.S. PATENT DOCUMENTS 4,847,780 A 7/1989 Gilker et al.
8,270,130 B1 9/2012 McMullen
(Continued)

FOREIGN PATENT DOCUMENTS

EP 2278344 A2 1/2011
EP 2827154 A1 1/2015
(Continued)

OTHER PUBLICATIONS

"IEEE Std 802.15.1, Part 15.1: Wireless medium access control (MAC) and physical layer (PHY) specifications for wireless personal area networks (WPANs)," IEEE Standards Association, Revision of IEEE Std. 802.15.1-2002; 2005, 600 pp. (Applicant points out, in accordance with MPEP 609.04(a), that the year of publication, 2005, is sufficiently earlier than the effective U.S. filing date, Sep. 8, 2016, so that the particular month of publication is not in issue.).

(Continued)

*Primary Examiner* — Giovanni Astacio-Oquendo
(74) *Attorney, Agent, or Firm* — Shumaker & Sieffert, P.A.

(57) ABSTRACT

Examples of devices described in the present disclosure include a monitoring probe comprising a sensor circuit comprising an electrical sensor, the sensor circuit configured to monitor a level of current flow through an electrical conductor when the electrical sensor is affixed adjacent to the electrical sensor, a wireless transmission circuit coupled to the electrical sensor, the wireless transmission circuit configured to receive the electrical output signal from the electrical sensor, and to wirelessly transmit data from the wireless transmission circuit, and a clip assembly coupled to the electrical sensor, the clip assembly mechanically coupled to the sensor circuit and having a plurality of clip members defining a retention area, wherein the plurality of clip members are configured to receive the electrical conductor within the retention area and exert a force on the conductor therein to affix the electrical sensor at a location adjacent to the electrical conductor.

21 Claims, 11 Drawing Sheets

(56) References Cited

U.S. PATENT DOCUMENTS

| | | | |
|---|---|---|---|
| 8,610,438 B1 | 12/2013 | Sykora et al. | |
| 2006/0217906 A1* | 9/2006 | Barbara | G01J 1/36 702/60 |
| 2010/0013457 A1 | 1/2010 | Nero, Jr. et al. | |
| 2010/0090683 A1 | 4/2010 | Bose et al. | |
| 2010/0231198 A1 | 9/2010 | Bose et al. | |
| 2010/0237853 A1 | 9/2010 | Bose et al. | |
| 2010/0281854 A1* | 11/2010 | Huang | F02D 41/1495 60/276 |
| 2010/0300230 A1* | 12/2010 | Helmer | B25J 9/106 74/469 |
| 2011/0172938 A1 | 7/2011 | Gu et al. | |
| 2012/0001617 A1 | 1/2012 | Reynolds | |
| 2012/0038446 A1 | 2/2012 | McBee et al. | |
| 2012/0182023 A1* | 7/2012 | Zhang | G01M 11/3109 324/501 |
| 2012/0319676 A1 | 12/2012 | El-Essawy et al. | |
| 2014/0312893 A1 | 10/2014 | Burkart et al. | |
| 2018/0080861 A1* | 3/2018 | Lafian | G01L 1/005 |
| 2018/0274984 A1* | 9/2018 | Xin | G01K 1/143 |

FOREIGN PATENT DOCUMENTS

| | | |
|---|---|---|
| EP | 2960662 A1 | 12/2015 |
| JP | 2009535623 A | 10/2009 |
| JP | 2014510269 A | 4/2014 |
| JP | 2015076955 A | 4/2015 |
| JP | 2015184179 A | 10/2015 |
| WO | 2007127617 A2 | 11/2007 |
| WO | 2012107845 A1 | 8/2012 |
| WO | 2013136935 A1 | 9/2013 |
| WO | 2015110672 A1 | 7/2015 |

OTHER PUBLICATIONS

"IEEE Std 802.11-2012, Part 11: Wireless LAN Medium Access Control (MAC) and Physical Layer (PHY) Specifications," IEEE Standards Association, Mar. 29, 2012, 2793 pp.

"IEEE Std 802.15.4-2015, IEEE Standard for Low-Rate Wireless Networks," IEEE Standards Association, Revision of IEEE Std 802.15.4-2011, Apr. 22, 2016, 708 pp.

"Innovative Solutions Demand Innovative Products," Precision Air and Energy Services, LLC, retrieved from http://www.precisionenergyllc.com/products, 2013 (Applicant points out, in accordance with MPEP 609.04(a), that the year of publication, 2013, is sufficiently earlier than the effective U.S. filing date, Dec. 2, 2016, so that the particular month of publication is not in issue.) 1 pp.

"Fluke A3000 FC Wireless AC Current Clamp Module," myflukestore.com, retrieved from http://www.myflukestore.com/product/fluke-a3000-fc-wireless-ac-current-clamp-module, on Mar. 1, 2017, 3 pp.

Extended Search Report from counterpart European Application No. 16203894.7, dated Jul. 5, 2017, 12 pp.

Notification of Reason for Rejection, and translation thereof, from counterpart Japanese Application No. 2016-242341, dated Jan. 30, 2018, 17 pp.

EP Application No. 16203894.7 Response to Office Action dated May 15, 2018, filed Oct. 31, 2018, 69 pp.

JP Application No. 2016-242341 Office Action dated Oct. 2, 2018, 4 pp.

Response to Office Action filed in Japanese Application No. 2016-242341 dated Dec. 19, 2018, 11 pp, (Translation provided for amended claims only).

Office Action issued in Japanese Application No. 2016-242341 dated Jan. 29, 2019, 4 pp.

Intent to Grant issued in European Application No. 16203894.7 dated Feb. 1, 2019, 5 pp.

* cited by examiner

POWER MONITORING PROBE FOR MONITORING POWER DISTRIBUTION IN AN ELECTRICAL SYSTEM

TECHNICAL FIELD

The disclosure relates to devices and methods for monitoring electrical current flow and other parameters in an electrical system.

BACKGROUND

A large scale data centers or computing environments, such as a network services exchange provider or co-location provider, typically include significant computing resources and infrastructure. Data centers may be shared by the multiple tenants locating networking equipment within the data centers. As such, a data center typically includes numerous electronic devices that produce heat, including network, server, and storage equipment. The data center may also include a variety of other equipment, such as cooling units to supply cool air so as to regulate temperature within the data center.

Each data center typically includes a number of primary and backup power distribution units for distributing power to devices within the facility. For example, the electrical power system of the data center includes one or more electrical power sources, and an arrangement of electrical conductors utilized to distribute the electrical power provided by the one or more power sources to various electrical loads that are to be powered by the system. The conductive pathways may be referred to as "branch circuits," wherein each branch circuit comprises conductors, for example conductive metal wires, that electrically couple the loads to be powered to the one or more power sources in the system. A given branch circuit may branch into multiple additional branch circuits, depending on the arrangement of the electrically conductive pathways. In addition, a branch circuit in general is configured to electrically couple one or more of the loads to be powered by the system to one or more of the power sources provided in the system.

In operation, electrical power, in the form of a flow of current, is provided to the branch circuits by the conductive pathways. Under normal operating conditions, the level of the current flow through any given one of the branch circuits is determined by the current requirements dictated by the load or loads coupled to that particular branch circuit. Under other conditions, such as when an open circuit, a short circuit, or a ground-fault condition occurs in the system, the flow of current from the power sources and/or through one or more of the branch circuits may be affected by these other conditions, and may be partially or entirely dictated by the particular condition instead of being dictated by that loads as would occur under normal operating conditions. In many instances, the ability to monitor the current flow within one or more portions of the system is helpful for diagnosis of electrical problems within the system, and in some instances may be required, for example by law or for compliance with other safety regulations or standards.

SUMMARY

In general, this disclosure describes examples of a power monitoring probe that comprises an electrical sensor circuit and a clip assembly or other attachment mechanism that allows the sensor circuit to be affixed adjacent to an electrical conductor, such as but not limited to an electrical wire in an electrical power distribution system. The sensor circuit is configured to sense an electrical characteristic, such as current flow, in the adjacent electrical conductor, and to generate an electrical output signal indicative of the level of the current flow in the electrical conductor. The sensor circuit operates using a sensing mechanism, such as a Hall effect device, that does not require the sensor circuit to be electrically coupled to, or to be in direct physical contact with, the electrically conductive element of the electrical conductor. For example, the clip assembly can be designed to attach to an insulated element surrounding the electrically conductive element of the electrical conductor, the insulated element surrounding a portion, for example a length of, of the electrical conductor where the clip assembly and electrical sensor are to be installed. Once installed, the clip assembly holds the sensor circuit in a position affixed and adjacent to and/or nearby (e.g., at some predetermined distance from) the electrical conductor, wherein in some examples neither the clip assembly nor the sensor circuit are in physical contact with the electrically conductive element of the electrical conductor. In other examples, the clip assembly itself may be in contact with the electrically conductive element of the electrical conductor, but wherein the clip assembly comprises an insulated material, and is configured to affix the sensor circuit in a location adjacent to and nearby the electrically conductive element while preventing the sensor circuit from coming into contact or being electrically coupled to the electrically conductive element. This alternative examples includes applications where the electrical conductor is not surrounded by an insulated layer, such as when the electrical conductor comprises a "bare" wire, in the portion of the electrical conductor where the power monitoring probe is intended to be attached to the electrical conductor.

Because examples of the sensor circuit of the power monitoring probe described herein only need to be located as some distance (e.g., no more than some predefined distance away) from the electrical conductor for which the probe is monitoring a current flow through, the probe may provide the advantage of not having to be part of the electrical circuit formed by the electrical conductor being monitored, and does not require the sensor circuit to be in electrical contact or to be electrically coupled with the electrically conductive element of the electrical conductor. In various examples, the clip assembly coupled to the sensor circuit can simply be attached (clipped) to the electrical conductor, and thus affix the sensor circuit in a proper location and at a proper distance relative to the electrical conductor in order to provide current monitoring of the flow of current through the electrical conductor. In various examples, the clip assembly and the sensor circuit are small with respect to overall dimensions, and thus can be clipped onto the electrical conductor as the electrical conductor exists in its current form, without having to move or otherwise disturb or physically rearrange the electrical conductor.

In addition, various examples of the power monitoring probe as described herein are configured to provide wireless communication of data or data transmitted and received by PLC (power line carriers), related to the current flow being sensed in an electrical conductor that is being monitored by the probe. As such, the power monitoring probes can be mounted permanently or semi-permanently onto one or more electrical conductors in an electrical system, and having each power monitoring probe configured to provide data, via wireless transmissions from the probe, which can be received and further processed by one or more devices located externally to the power monitoring probe or probes.

This feature allows a power monitoring probe or a plurality of power monitoring probes to be installed on a system to provide data related to current flows in one or more portions of the system, and to process this data using external devices, such as a computer, to provide and generate information about the system's performance. Information about the performance of an electrical system may include system power monitoring functions and detection of electrical and/ or device fault conditions, as further described herein. The external device(s) receiving data from the one or more power monitoring probes as described in the present disclosure can perform analysis of the received data, and based on the analysis of the received data, can provide statistical information about the performance of the system, such as power usage and efficiency, and can also be configured to monitor for fault conditions in the system, such as short circuit, open circuit, and for ground-fault conditions.

Because of the low cost of the power monitoring probes described herein, several probes can be installed in a system without excessive cost, and by having more probes installed throughout an electrical system allow for quick and accurate detection directed to the specific portion of the electrical system that may be generating a fault condition. In addition, because of the ease of installation of the power monitoring probes as described in the present disclosure, in some examples as simple as clipping the probe onto the electrical conductor, the power monitoring probes as described herein can be installed quickly and easily when a need to monitor current arises, such as when a fault condition or some other irregularity in an electrical system is present or is suspected, but wherein the system does not presently have sensors or other or other devices to help with the monitoring and detection of any such fault condition. Because examples of the probes described herein are configured to transmit data regarding current flows, the devices can be installed in electrical system and can operate without the need for an operator, such as an electrician, being exposed to the wiring and electrical potentials present in the electrical system, thus provide a measure of safety with respect to monitoring and troubleshooting of an electrical system. For example, in contrast to a meter or other clamp-on type current measuring devices with a display that provides an indication of current flow as part of the device, the power monitoring probes as described herein may be installed in an electrical system, and then the system may be operated and the electrical current(s) may be monitored remotely (e.g., from outside the electrical panels and at a safe distance from the electrical conductors and device of the electrical system), based on information derived from the sensed current flows wirelessly transmitted by the power monitoring probes.

In various examples, the sensor circuit of the power monitoring probes may be configured to sense other parameters associated with the electrical conductors. Examples of the power monitoring probes as described herein may also include a temperature sensor configured to sense temperature in the vicinity of the sensor circuit, and to provide an output signal indicative of the sensed temperature. In some instances, an excessive amount of heat is generated in an electrical conductor under circumstances where the electrical conductor is carrying a level of current that is in excess of the level of current the electrical conductor is rated to carry. This excessive heat can create electrical problems in the system, such as overheating of the devices in the system coupled to the electrical conductor, or an opening of the conductor itself (creating an open circuit fault), and in some instances may lead to a fire being ignited in the electrical system. Such problems may be monitored for and detected through the use of the temperature sensor included in examples of the power monitoring probes described herein.

Various examples the disclosure is directed to monitoring probe comprising: a sensor circuit comprising an electrical sensor, the sensor circuit configured to monitor a level of current flow through an electrical conductor when the electrical sensor is affixed adjacent to the electrical sensor, wherein the electrical sensor comprises a sensing element configured to generate an electrical output signal indicative of the level of current flow through the electrical conductor when the electrical sensor is affixed adjacent to the electrical conductor without being electrically coupled to the electrical conductor, a wireless transmission circuit coupled to the electrical sensor, the wireless transmission circuit configured to receive the electrical output signal from the electrical sensor, and to wirelessly transmit data as a wireless output signal from the wireless transmission circuit, the data indicative of the level of current flow through the electrical conductor; and a clip assembly coupled to the electrical sensor, the clip assembly mechanically coupled to the sensor circuit and having a plurality of clip members defining a retention area, wherein the plurality of clip members are configured to receive the electrical conductor within the retention area and exert a force on the conductor therein to affix the electrical sensor at a location adjacent to the electrical conductor.

Other examples described in this disclosure are directed to a probe clip assembly comprising: a first clip member; a second clip member coupled to the first clip member; the first clip member and the second clip member configured to partially enclose a retention area configured to receive a portion of an electrical conductor, the first clip member and the second clip member configured to at least partially surround the portion of the electrical conductor when the electrical conductor is fully received in the retention area, and to exert a force the portion of the electrical conductor received in the retention area in a manner that affixes the probe clip assembly to the electrical conductor; and a housing coupled to the first clip member and the second clip member, the housing configured to receive a sensor circuit and to position the sensor circuit at a location adjacent to the electrical conductor when the electrical conductor is received in the retention area and the probe clip assembly is affixed to the electrical conductor, the sensor circuit configured to monitor one or more parameters associated with the electrical conductor, and to wireless transmit data associated with the one or more parameters.

Other examples described in this disclosure are directed to a kit of parts for forming a monitoring probe comprising: at least one sensing circuit a sensor circuit comprising an electrical sensor and a wireless transmission circuit coupled to the electrical sensor, the sensor circuit configured to monitor a level of current flow through an electrical conductor r, wherein the electrical sensor comprises a sensing element configured to generate an electrical output signal indicative of the level of current flow through the electrical conductor when the electrical sensor is located adjacent to the electrical conductor without being electrically coupled to the electrical conductor, and the wireless transmission circuit configured to receive the electrical output signal from the electrical sensor, and to wirelessly transmit data as a wireless output signal from the wireless transmission circuit, the data indicative of the level of current flow through the electrical conductor; and a plurality of clip assemblies, each of the plurality of clip assemblies configured to be mechanically coupled to the at least one sensor circuit, and wherein each of the plurality of clip assemblies includes a pair of clip members that is configured to receive a size range of electrical conductors in a retention area formed by the clip members, and wherein one or more of the plurality of clip assemblies is confined to receive a size range of electrical conductors that is a different size range than at least one other of the plurality of clip assemblies is configured to receive.

Other examples described in this disclosure are directed to a method comprising selecting a sensor circuit for a current sensing application; selecting a clip assembly for the current sensing application; coupling, mechanically, the sensor circuit to the clip assembly; coupling the clip assembly mechanically to an electrical conductor, wherein coupling the clip assembly to the electrical conductor comprises coupling the clip assembly so that the sensor circuit is affixed adjacent to and at a predetermined distance from the electrical conductor; sensing, using the sensor circuit, a level of electrical current flowing through the electrical conductor; generating, by the sensor circuit, an electrical output signal indicative of the level of current flowing through the electrical conductor, and wirelessly transmitting, by a wireless transmission circuit, a wireless output signal comprising data, the data indicative of the level of current flow through the electrical conductor.

Additional examples described in this disclosure are directed to a system comprising: an electrical power distribution system including an electrical power source and a branch circuit comprising a load, a first conductor electrically coupling the branch circuit and the load to the electrical power source through the first conductor, wherein the first conductor is configured to form a portion of an electrical circuit configured to provide a path for a current flow between the load and the electrical power source; a sensor circuit mechanically coupled to the first conductor, the sensor circuit comprising a current sensor circuit and a wireless transmission circuit, the current sensor circuit communicatively coupled to the wireless transmission circuit, the current sensor circuit located adjacent to the first conductor and configured to sense a level of current flowing through the first conductor, and to provide an electrical output signal indicative of the sensed level of current flowing through the first conductor, the wireless transmission circuit configured to receive the electrical output signal from the current sensor circuit and to wirelessly transmit data from the wireless transmission circuit, the data indicative of the level of current flowing through the first conductor.

These examples and other examples and advantages of the devices, systems, and methods as described in this disclosure are further described below.

BRIEF DESCRIPTION OF DRAWINGS

The details of one or more examples of this disclosure are set forth in the accompanying drawings and the description below. Other features, objects, and advantages of this disclosure will be apparent from the description and drawings, and from the claims.

The drawings and the description provided herein illustrate and describe various examples of the inventive methods, devices, and systems of the present disclosure. However, the methods, devices, and systems of the present disclosure are not limited to the specific examples as illustrated and described herein, and other examples and variations of the methods, devices, and systems of the present disclosure, as would be understood by one of ordinary skill in the art, are contemplated as being within the scope of the present disclosure.

DETAILED DESCRIPTION

Figure 1:
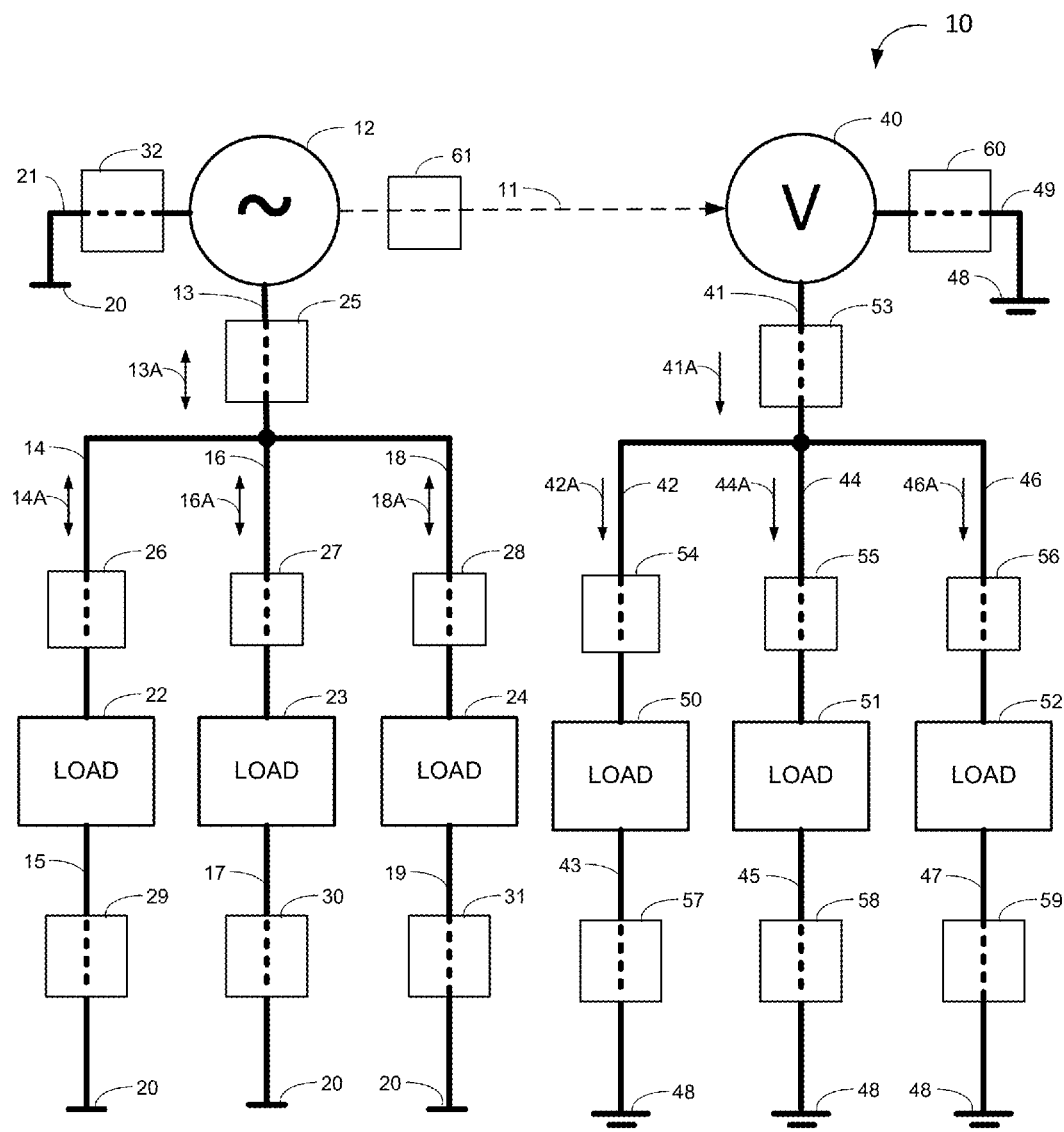
FIG. 1 is a block diagram illustrating an example electrical power distribution system in which one or more power monitoring probes are deployed according to various examples described herein.

FIG. 1 is a block diagram illustrating an example electrical power distribution system 10, such as a power distribution system within a data center or high end computing environment, in which one or more power monitoring probes are deployed according to various examples described herein. As further described herein, an operator can easily deploy, reposition and remove individual probes within system 10. Each of the probes senses electrical properties (e.g., current) within the adjacent power distribution conductor and wirelessly transmits data to one or more externals devices (not shown in FIG. 1). The wireless transmissions that are transmitted from the probes may be received by the external device and analyzed to detect faults in system 10. As described, each of the probes may be configured such that the probe can easily be removable, installed and repositioned within system 10. Power monitoring probes connected to branch circuits will be used to monitor customer power consumption for trending and billing. The overall power consumption will be used for power balancing at distribution panels.

As illustrated, system 10 comprises an (AC) power source 12 and a (DC) power source 40. AC power source 12 is not limited to a particular type of source, or to a source of alternating current having any particular parameters related to voltage, current, and/or phase. In various examples, AC power source 12 is a source of alternating current commonly provided by a commercial power provider, for example a Volt RMS source (120 Vac or 480 Vac or other) having a frequency of 60 hertz, as is commonly used as a residential or a commercial power source in the United States and 50 hertz in Europe or Asia. Other voltages, including both higher and lower voltages, could be measured in various portions of system 10 using example devices and techniques described herein. As illustrated, AC power source 12 comprises a main output branch circuit 13 coupled to three individual branch circuits represented by electrical conductors 14, 16, and 18. Each of the branch circuits is coupled to a load 22, 23, and 24, respectively. Loads 22, 23, 24 are not limited to any particular type of load, and may be any load that is configured to receive electrical power from AC power source 12. In some examples, one or more of loads 22, 23, and 24 may be an AC motor, a compressor, a fan, and air conditioning unit, and other types of loads that are utilized in a data center. Load 22 is coupled to AC power source 12 through electrical conductor 14, and completes an electrical connection to AC power source 12 through electrical conductor 15 coupled to reference voltage point 20. Reference voltage point 20 is coupled to AC power source 12 through electrical conductor 21. Load 23 is coupled to AC power source 12 through electrical conductor 16, and completes an electrical connection to AC power source 12 through electrical conductor 17 coupled to reference voltage point 20. Load 24 is coupled to AC power source 12 through electrical conductor 18, and completes an electrical connection to AC power source 12 through electrical conductor 19 coupled to reference voltage point 20. Electrical conductors 14, 16, 18 may be, for example, independent electrical wires fed through a physical environment, such as a data center or other complex computing environment.

In the example of FIG. 1, each of the three branch circuits has separate current flowing through the electrical conductors of the branch circuit, represented by arrows 14A, 16A, and 18A respectively. As illustrated, arrow 14A represents an alternating current (AC) flow through electrical conductors 14 and 15, which is also being provided to load 22. Under normal operating conditions, (e.g. no fault conditions existing on the branch circuit), the amount of current flowing though electrical conductor 15 will be equivalent to the amount of current flowing through electrical conductor 14 at any given time. In addition, under normal operating conditions the amount of current flowing through electrical conductors 14 and 15 will substantially be determined by the power requirements of the load 22, neglecting any voltage variations occurring as the output voltage from source 12.

As shown in FIG. 1, power monitoring probe 26 may be affixed to electrical conductor 14, and another power monitoring probe 29 may be affixed to electrical conductor 15. As used with reference to FIG. 1, "affixed" means that the probes 26 and 29 are at least temporarily secured in a physical position that is adjacent to the respective electrical conductors 14 and 15, and comprise a sensor circuit that is positioned at some distance respectively from the electrical conductors 14 and 15, but wherein the sensor circuits are not electrically coupled to these electrical conductors. The fact that the sensor circuits of probes 26, 29 are not electrically coupled to the respective electrical conductors 14, 15 is illustrated by the use of the dashed line through the probe symbols in the figure, representative of the probe be physically attached to but not part of the electrical circuit that electrical conductors 14 and 15 are a part of. As further explained herein, examples of probes 26 and 29 may be clipped onto an electrical conductor, such as electrical conductors 14, and 15, without the sensor circuit within the probe having to be electrically coupled to the electrically conductive element comprising electrical conductors 14, and 15. Once clipped onto the respectively electrical conductors, probes 26 and 29 are configured to sense a current flow in the electrical conductor which they are located adjacent to, and to wirelessly transmit data to one or more externals devices (not shown in FIG. 1), the data indicative of information related to the sensed current flows. In system 10, probe 26 is attached to electrical conductor 14, and is configured to sense current flows, e.g. current flow 14A, and to wirelessly transmit data including information indicative of the current flows through electrical conductor 14. Probe 29 is attached to electrical conductor 15, and is configured to sense current flows in electrical conductor 15, and to wirelessly transmit data including information indicative of the current flows through electrical conductor 15.

The wireless transmissions that are transmitted from probes 26, 29 may be received by external devices (not shown in FIG. 1), and analyzed to detect faults in system 10. For example, by monitoring the current flows through conductor 14 against for example a maximum current level expected to be drawn by load 22, current loads in excess of this maximum current level can be a set to trigger an over-current alarm condition. Such an overcurrent condition can occur for example when the load is not functioning properly, for example when a motor is beginning to or is experiencing a locked-rotor condition, and begins to draw an unexpected level of current. An excess current draw through electrical conductor 14 may also be indicative of a short circuit condition in the branch circuit comprising electrical conductors 14, 15 and load 22.

In another example, as noted above under normal operating conditions the current flow through electrical conductors 14 and 15 should be the same level of current at any given time. If one of probes 26, 29 senses a level of current flow that is different from the level of current flow sensed by the other probe by some predetermined amount, (e.g., the level of current flow in electrical conductors 14, 15 is not the same at some point in time), a ground-fault condition may exist in the branch circuit. A ground-fault condition exits when current in a circuit at one point "leaks" to a reference voltage level, such as reference voltage level 20 in FIG. 1, without having passed through the load, such as load 22. Such conditions may represent a shock hazard to personnel around the devices and/or equipment associated with system 10, and in some jurisdictions, these faults are required to be detected and interrupted (e.g., power to the circuit turned off or removed) when the ground-fault condition is detected. By using two probes 26 and 29 on a common branch circuit, and by comparing the current flows sensed by the two probes, a ground-fault condition may be detected in the branch circuit if such a condition occurs.

In other examples, a current flow through electrical conductors 14, 15 as sensed by probes 26 or 29, respectively, may be compared against a minimum current flow level, and if below that minimum current flow level, may be indicative of an open circuit condition. For example, load 22 may comprise an internal fuse that if blown, would prevent load 22 from allowing a current flow through conductors 14 and 15. Such a condition may also exist if one of electrical conductors 14, 15 has been broken or has become somehow disconnected at some point from the branch circuit, e.g., an open circuit condition exists. By detecting a state where current is not flowing through electrical conductor 14, 15 when load 22 is expected to be powered up and operating, analysis of the data sensed and transmitted from one or both of probes 26, 29 may be used to determine that an open circuit condition in the branch circuit comprising electrical conductors 14, 15, and load 22 is present.

In addition to the detection of fault conditions in a branch circuit or an electrical system, probes 26, 29 may be used to monitor and collect data related to current flows, and thus to the amount of power used by a load, such as load 22. By adding date and time information associated with the sensed current flows, analysis of the data can be performed to extract information and to detect trends related to load usages, efficiencies, and for example to determine proper timing of routine maintenance that may need to be performed on a system based for example on system run-time information derived from monitoring the sensed current flows.

As illustrated, arrow 16A represents an alternating current (AC) flow through electrical conductors 16 and 17, which is also being provided to load 23. Under normal operating conditions, the amount of current flowing through electrical conductors 16 and 17 will substantially be determined by the power requirements of the load 23, neglecting any voltage variations occurring as the output voltage from source 12. Probes 27 and 30 are attached to electrical conductors 16 and 17, respectively, and may perform any of the same functions described above with respect to probes 26 and 29, but with respect to the branch circuit comprising electrical conductors 16, 17 and load 23. Similarly, arrow 18A represents an alternating current (AC) flow through electrical conductors 18 and 19, which is also being provided to load 24. Under normal operating conditions, the amount of current flowing through electrical conductors 18 and 19 will substantially be determined by the power requirements of the load 24, neglecting any voltage variations occurring as the output voltage from AC power source 12. Probes 28 and 31 are attached to electrical conductors 18 and 19, respectively, and may perform any of the same functions described above with respect to probes 26 and 29, but with respect to the branch circuit comprising electrical conductors 18, 19 and load 24.

In addition, as illustrated in FIG. 1 system 10 includes a power monitoring probe 25 located adjacent to electrical conductor 13, wherein electrical conductor 13 provides the main output conductor from AC power source 12, and a power monitoring probe 32 located adjacent to electrical conductor 21, wherein electrical conductor 21 provides the low voltage return path for current to AC power source 12. Probes 25 and 32 are configured to provide any of the functions described for probes attached to system 10, and also including sensing the overall current flows provided by AC power source 12. Probes 25 and 32 may also be used in combination to detect an overall ground-fault condition for any of the circuits powered from AC power source 12 between and/or a ground-fault condition caused by electrical conductors 13 and 21.

Use of power monitoring probes is not limited to sensing current in an alternating current portion of the system 10, and system 10 may include any number of power sources of different types. As illustrated in the example of FIG. 1, system 10 may include an additional power source, for example, in the form of a direct current (DC) source 40. DC power source 40 is not limited to a particular type of source, or to a source of direct current having any particular parameters related to voltage or current. The DC power source is not limited to providing DC power at any particular voltage, and may provide for example 24 volts, any other voltage, including higher and lower voltages that may be provided by the DC power source or sources within system 10. In various examples, DC power source 40 is a source of direct current used to power electronic circuits and low voltage devices (not specifically shown in FIG. 1). In this example, DC power source 40 comprises a main output branch circuit 41 coupled to three individual branch circuits represented by electrical conductors 42, 44, and 46. Each of the branch circuits is coupled to a load 50, 51, and 52, respectively. Load 50 is coupled to DC power source 40 through electrical conductor 42, and completes an electrical connection to DC power source 40 through electrical conductor 43 coupled to reference voltage point 48. Reference voltage point 48 is coupled to DC power source 40 through electrical conductor 49. Load 51 is coupled to DC power source 40 through electrical conductor 44, and completes an electrical connection to DC power source 40 through electrical conductor 45 coupled to reference voltage point 48. Load 52 is coupled to DC power source 40 through electrical conductor 46, and completes an electrical connection to DC power source 40 through electrical conductor 47 coupled to reference voltage point 48.

The direct current flowing through the branch circuit comprising electrical conductors 42, 43 and load 50 is represented by arrow 42A. Probe 54 is attached to electrical conductor 42, and is configured to sense current flows through electrical conductor 42. Probe 57 is attached to electrical conductor 43, and is configured to sense current flows through electrical conductor 43. The direct current flowing through the branch circuit comprising electrical conductors 44, 45 and load 51 is represented by arrow 44A. Probe 55 is attached to electrical conductor 44, and is configured to sense current flow through electrical conductor 44. Probe 58 is attached to electrical conductor 45, and is configured to sense current flow through electrical conductor 45. The direct current flowing through the branch circuit comprising electrical conductors 46, 47 and load 52 is represented by arrow 46A. Probe 56 is attached to electrical conductor 46, and is configured to sense current flow through electrical conductor 46. Probe 59 is attached to electrical conductor 47, and is configured to sense current flow through electrical conductor 47. Loads 50, 51, and 52 are not limed to any particular type of load, and may be any load operable to receive power from DC power source 40. Under normal operating conditions, the level of current flows 42A, 44A, and 46A are dictated by the power requirements of load 50, 51, 52 respectively. Probes 54-59 may be configured to perform any of the current sensing and/or monitoring functions described above with respect to probes 26-31 or any of the examples probes described herein, but with respect to the electrical conductors and loads coupled to receive power from the DC power source 40.

As illustrated, additional probe 53 may be attached to the main conductor 41 providing the main output from DC power source 40, and additional probe 60 is attached to electrical conductor 49, wherein electrical conductor 49 provides the main return path for current to DC power source 40. Probes 53 and 60 may be configured to perform any of the current sensing function described for probes illustrated in system 10, or otherwise described herein, but with respect to the overall current flows provided by DC power source 40. In some electrical systems, it is common to power a DC source, such DC power source 40, from an existing AC power source in the system, such as AC power source 12. As illustrated in FIG. 1, AC power source 12 be coupled to DC power source 40 in order to provide the power to operate DC power source 40, as illustrated by electrical connection 11. Electrical connection 11 may comprise two or more electrical conductors in various examples, which provide the electrical circuit used to power DC power source 40. One or more probes, illustratively represented by probe 61, may be attached to the electrical connection 11 to monitor current flow(s), and to wirelessly transmit data related to these current flow(s) to external devices (not shown in FIG. 1), and described above for other probes in system 10, and as otherwise described for examples of probes described herein.

As further described below, examples of probes used in system 10 may be powered by an on-board battery within each probe, such that no external power and no additional power connections are required in order for the probes to operate to sense current flows, and to perform any other functions described herein, including wireless transmission of data. Further, the power monitoring probes, as further described herein, are small in size, often taking up only 1000 to 800 mm cube of space, and so can be installed adjacent to an electrical conductor in small areas, such as inside electrical cabinets, were there is little additional space for additional equipment to be located.

In addition, because each of the probes of system 10 may comprises just a sensor circuit, a wireless transmitter, a battery, and a clip assembly or other attachment device to allow the sensor circuit, wireless transmitter and the battery to be attached to an electrical conductor, the sensor circuit configured to transmit data related to current flows to external devices, the probes are inexpensive on a per/probe basis. Therefore, multiple probes can be installed as shown in FIG. 1 on a single system, such as system 10, as individual probes can be removed and/or repositioned easily. In addition, probes may also use power harvesting methods by capturing power from electromagnetic emissions from the conductor that the probe is affixed to (e.g., by virtue of electromagnetic coupling), to trickle charge a battery or a super capacitor used to power the integrated circuit. In these examples, the probe will have on-board electronics configured to perform the power harvesting and charging functions.

By using a plurality of removable probes on a single system, faults conditions, such as ground-fault conditions as described above, can be detected, providing a safety feature, and also may provide compliance to legal or regulatory requirements for ground-fault detection. Also, as opposed to having one overall current sensing device or mechanism that may be built into a system to sense current for an entire electrical system at one specific point in the system, the low cost per/probe of the example probes described herein allow for, and would encourage use of, multiple probes attached to various points in an electrical system 10. By using multiple probes attached throughout system 10, when a fault condition does occur at a particular location in the system, or because of a particular device, having the information related to current flows in the different branch circuits allow for quick diagnosis and the ability to pinpoint the portion of the circuit that generated the fault condition, thus reducing the time to troubleshoot, and to ultimately repair and restore the system to a safe and proper operating condition.

Further, because of the low cost, the probes can be installed on system, such as system 10, in a permanent manner, and thus provide the monitoring and analysis features discussed herein over longer period of time, not just when a problem or a fault condition is present in the system. In addition, since the probes are configured to wirelessly transmitted data related to sensed current flows, the probes may be enclosed in an electrical cabinet or other electrical enclosure during operation of the system, and to provide data related to current flow in the system without the need for personnel, such as an electrician or a technician, to be exposed to the electrical conductors and electrical voltage potential present in the system while still being able to monitor current flow in the system in real time. This feature of remote current monitoring provides an added level of safety for the personnel who are required to operate and maintain the system.

The functions of one or more of the probes illustrated in system 10 are not necessarily limited to providing current sensing, and may include any of the functions, such as temperature sensing, as described herein. Additional details regarding probes according to the techniques described herein are further described below, for example with respect to FIGS. 2A-2G, FIG. 3 and FIG. 3A.

Figure 2A:
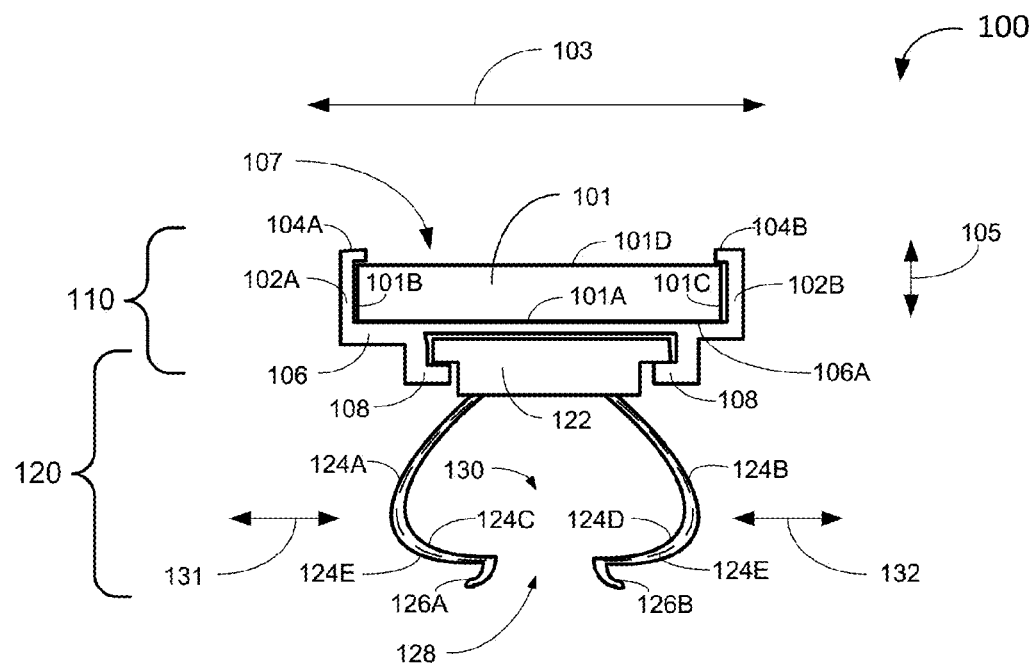
FIG. 2A is an end view of a power monitoring probe according to various examples described herein.
Figure 2A:
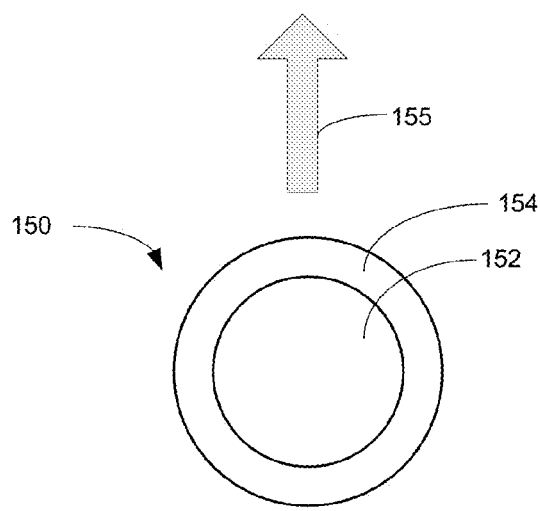

FIG. 2A is an end view of a power monitoring probe 100 according to various examples described herein. As illustrated, probe 100 comprises a sensor circuit 101 retained in a housing 110, the housing 110 and sensor circuit 101 coupled to a clip assembly 120. Sensor circuit 101 is illustrative of any of the electronic sensor circuits as described herein, or the equivalents thereof, and is not limited to any particular type of electronic sensor circuit. In various examples, the sensor circuit 101 comprises an electronic sensor, a wireless transmission circuit, and a power source, such as a battery, as further illustrated and described with respect to FIG. 3 and FIG. 3A.

Referring again to FIG. 2A, housing 110 comprises a housing bottom 106, sides 102A, 102B, and sensor circuit retention lips 104A, 104B. Sides 102A, 102B are attached to housing bottom 106 along opposite edges of housing bottom 106, and extend some distance in a same direction away from a top surface 106A of housing bottom 106. Each of sides 102A, 102B further comprises a sensor circuit retention lip 104A, 104B, respectively. The sensor circuit retention lips 104A, 104B extend from a top edge of one of the sides 102A, 102B, respectively, in a direction back toward and over the sensor circuit 101. As such, housing 110 forms a partially enclosed cavity comprising bottom portion 106, sides 102A, 102B, and retention lips 104A, 104B, the cavity configured to secure sensor circuit 101 at least partial within and mechanically coupled to the housing 110. As shown in FIG. 2A, top surface 106A of housing bottom 106 provides a surface to receive and physically contact a bottom surface 101A of sensor circuit 101. Sides 102A, 102B are configured to retain or to at least provide a limit to an amount of lateral travel, represented by arrow 103, allowed for a first side 101B and a second side 101C of sensor circuit 101 within housing 110. Retention lips 104A, 104B extend away from sides 102A, 102B, respectively, and partially over a top surface 101D of sensor circuit 101. Retention lips 104A, 104B are configured to retain or to at least provide a limit to an amount of vertical travel, represented by arrow 105, allowed for sensor circuit 101 relative to the housing bottom 106.

In various examples, at least one end of housing 110 is open such that sensor circuit 101 may be inserted into the housing 110. While being inserted in this manner, bottom surface 101A of sensor circuit 101 moves along top surface 106A of housing 110, sides 101B and 101C of sensor circuit 101 move along or are in close proximity to sides 102A, 102B, and top surface 101D of sensor circuit 101 remains underneath and is partially covered by each of retention lips 104A, 104B. In this example, the at least one end of housing 110 that is open may be the end of housing 110 as illustrated looking into the drawing as illustrated in FIG. 2A. In various examples, sensor circuit 101 may be advanced into housing 110 as described above to a position such that bottom surface 101A and sides 101B, 101C of the sensor circuit are completely positioned within the partial cavity formed by top surface 106A, sides 102A, 102B, and retention lips 104A, 104B of housing 110. However, in alternative examples, the partial cavity formed by top surface 106A, sides 102A, 102B, and retention lips 104A, 104B of housing 110 may form a tunnel-like structure having a depth dimension (looking into the drawing as illustrated in FIG. 2A) that is less than a depth dimension (again, looking into the drawing as illustrated in FIG. 2A) of the sensor circuit 101. In various versions of this alternative example, the tunnel-like structure formed by the top surface 106A, sides 102A, 102B, and retention lips 104A, 104B only partially encloses the sensor circuit 101 along the depth dimension, wherein the sensor circuit 101 may extend beyond the tunnel-like structure of the housing 110 in one or both directions relative to the depth dimension of the housing.

In various examples, sides 102A, 102B of housing 110 comprise a material that is resiliently flexible, such that sides 102A, 102B may be flexed in an outward direction respectively the opposite side. When flexed in the outward direction, retention lips 104A and 104B move in a direction causing the retention lips to be farther away from each other, and creating a larger space (opening) in the top area 107 of the partial cavity formed in the housing 110. The expanding of the opening in the top area 107 of the partial cavity is configured to be sufficient to allow the sensor circuit 101 to be inserted through the opening in the top area 107 and into the partial cavity formed by the housing 110. Once sensor circuit 101 has be inserted to a position where sensor circuit 101 is received in the partial cavity formed by housing 110, and top surface 101D is within the partial cavity, sides 102A, 102B are configured to resiliently flex back toward each other such that retention lips 104A, 104B are move toward each other and to a position to partially cover over top surface 101D of sensor circuit 101. As such, housing 110 is configured allow insertion of a sensor circuit 101 through an opening in the top area 107 of the housing, and once the sensor circuit 101 is inserted into the partial cavity of the housing 110, to secure the sensor circuit 101 within the partial cavity via top surface 106A, sides 102A, 102B, and retention lips 104A, 104B.

In various examples, the dimensions of the partial cavity formed by housing 110 relative to the dimensions of sensor circuit 101 are such that when sensor circuit 101 is inserted into the partial cavity as described above, sides 102A, 102B form a friction fit with sides 101B, 101C of sensor circuit 101. The friction fit provide a retention force exerted on sensor circuit 101 that is adequate to prevent sensor circuit 101 from being moved from the partial cavity by forces such gravity or vibrational forces incident on the housing and/or sensor circuit 101 alone. As such, the housing 110 is configured to prevent the sensor circuit 101 from sliding out of the open end of the housing due to gravitational or vibrational forces, without the addition of other external force applied intentionally to the sensor circuit to extract the sensor circuit 101 from the housing 110. Further, sides 102A, 102B are configured to be resiliently flexible such that the sensor circuit 101, once installed in the housing 110, may be intentionally extracted from the partial cavity of the housing 110 by forces intentionally applied to the sensor circuit 101 and/or housing 110. Extraction of the sensor circuit 101 may be provided by pushing the sensor circuit 101 along the depth dimension of the sensor circuit to urge the sensor circuit out of the partial cavity and the housing 110 through an open end of the housing 110, or in the alternative by lifting the sensor circuit 101 upward in a direction away from top surface 106A, wherein sides 102A, 102B may be flexed to an extent that the spacing between retention lips 104A, 104B allows sensor circuit 101 to be removed from the housing 110 through the opening in the of top area 107 of the housing 110.

In various examples, the dimensions of the partial cavity formed by housing 110 relative to a height dimension of sensor circuit 101 as such that when sensor circuit 101 is received in the partial cavity, retention lips 104A, 104B are in contact with the upper surface 101D of sensor circuit 101, and provide a clamping force in a downward direction on the sensor circuit 101 toward top surface 106A. This downward force provided by retention lips 104A, 104B is configured to provide a clamping force that is adequate to prevent the sensor circuit 101 from sliding out an open end of the housing 110, for example when the housing 110 and sensing circuit are oriented in a direction that would allow any gravitational forces and/or vibrational forces to urge the sensing circuit 101 to slide out of an open end of the housing.

In various examples, housing 110 is formed as an overmolded structure, either completely or partially enclosing sensor circuit 101 in a manner wherein the housing 110 is permanently affixed to the sensor circuit 101, and is not generally detachable from the sensor circuit 101. In various examples, an adhesive (not shown in FIG. 2A) may be applied to the interior of the partial cavity formed by housing 110, and/or to one of more surface 101A, 101B, 101C, 101D of the sensor circuit 101 such that when the sensor circuit 101 is received with the partial cavity formed by housing 110, the adhesive holds sensor circuit 101 in place, either permanently, or in a detachable manner. In various examples, sensor circuit 101 is secured to top surface 106A of housing 110 using and adhesive (not shown in FIG. 2A) along bottom surface 101A of sensor circuit 101. In such examples, retention lips 104A, 104B, and/or sides 102A, 102B may not be provided as part of the housing 110, and the adhesive is configured to retain the sensor circuit 101 in place relative to housing 110 without the use of sides 102A, 102B or retention lips 104A, 104B.

Examples of the techniques described above for securing a sensor circuit 101 to and/or within a housing 110 are intended to be illustrative, and are not limited to these techniques. Other techniques for securing a sensor circuit to a housing, such as but not limited to retainer clip(s) (not shown in FIG. 2A), fastener(s) such as but not limited to screws (not shown in FIG. 2A), and sockets operable to receive pins, including zero-insertion force (ZIP) sockets and pins (not shown in FIG. 2A), and any equivalents thereof that would be understood by one of ordinary skill in the art are contemplated as ways of securing sensor circuit 101 to a housing, such as housing 110, as provided herein.

As illustrated, clip assembly 120 comprises a clip attachment block 122 and clip member 124A, 124B. Clip members 124A, 124B are mechanically coupled to clip attachment block 122, and extend away from clip attachment block 122 in a direction away from housing 110 to a distal ends 126A, 126B, respectively. Distal ends 126A, 126B are spaced apart from one and other to create an opening 128 between distal ends 126A, 126B. Opening 128 leads to a retention area 130 that is partially enclosed by clip members 124A, 124B, and extends from opening 128 to the clip attachment block 122. Retention area 130 is configured to receive a portion of an electrical conductor (illustratively shown as electrical conductor 150), and to secure probe 100 to the portion of the electrical conductor received within the retention area 130. In various examples, block 122 is formed of a material the allows electromagnet energy generated by and surrounding an electrical conductor received in retention area 130 to concentrate the electromagnetic energy in the area of block 122.

In various examples, the configuration of the clip members and/or the configuration of the distal ends of the clip members is designed to accept a defined range of sizes of electrical conductors. In some examples, the range of sizes is defined based on a wire gauge standard, such as the American Wire gauge (AWG) standard. However, in many instances, a particular gauge of wire may be provided with a variety of different types of insulative covering surrounding the conductive element (e.g. wire) of an electrical conductor. These insulative covering can have different thicknesses, resulting in variations in the outside dimensions of electrical conductors for a given same wire gauge. In other instances, a "bare wire" having no insulative cover, at least in the portion of the electrical conductor where the monitoring probe it to be affixed, is the electrical conductor of interest. As such, in some examples the "range of sizes" a particular set of clip members are configured to be affixed to may be defined by a range of sizes for an exterior surface, for example a circumference or a cross-sectional diameter, of the exterior surface of the electrical conductor in the portion of the electrical conductor that is to be received in the retention area form by the clip members of the clip assembly. For example, in the case of electrical conductor having a substantially round cross-sectional dimension, the range of sizes for a particular set to clip members may be specified in a measurement of the diameter of the cross-sectional dimension, for example as a diameter in a range of 0.5 to 1.0 inches. In this example a clip assembly configured to be attached to electrical conductor having this range of size would be designated to be affixed to electrical conductors having a diameter in cross-sectional in a range from 0.5 to 1.0 inches.

Different sets of clip members may be configured to have different sets of ranges sizes for electrical conductors that the clip members and clip assemblies would be configured to be affixed to. For example, a first set of clip members/clip assemblies may be configured to be affixed to electrical conductors having a first range of sizes with dimensions in a range from 3 mm to 6 mm, a second set of clip members/clip assemblies may be configured to be affixed to electrical conductors having a second range of sizes with dimensions in a range from 5 mm to 8 mm, and a third set of clip members/clip assemblies may be configured to be affixed to electrical conductors having a third range of sizes with dimensions in a range from 7 mm to 10 mm. Examples of clips having a range of sizes greater than 10 mm are also contemplated. In some examples, the range of sizes of one or more of the sets of clip members/clip assemblies overlap one another, i.e., some sizes for electrical conductors occur in more than one set of clip members/clip assemblies. In other examples, the range of for each of the clip members/clip assembly do not overlap. The number of different sets of clip members/clip assemblies, and thus the number of different ranges of sizes that may be provided is not limited opt any particular number of different sets, and may be one or a plurality of sets.

In various examples, the sets of clip members/clip assemblies designed to be affixed to a specific range of sizes of electrical conductors may be designed in some matter that is indicative of the designated range of sizes for that clip assembly. for example, a clip assembly may comprise at least some portion of the clip assembly, for example the clip members, that may be formed of a material having a particular color that corresponds to a particular range of sizes. for example, first clip assembly may comprise clip members formed of a material having a blue color corresponding to a first range of sizes of electrical conductors that the clip assembly is configured to be affixed to, while a second clip assembly may comprise clip members formed of material having a yellow color corresponding to a second range of sizes of electrical conductors that the second clip assembly is configured to be affixed to. Thus, the different color clip members may be utilized to quickly determine what size ranges of electrical conductors that particular clip assembly is configured to be affixed to. In the alternative or in addition to color, various marking, such as lettering, numbers, and/or actual numerical ranges may be printed on, engraved into, molded into, or other provided with the clip assemblies, the markings corresponding to the range of sizes the particular clip assembly is configured to be affixed to. These variations in clip assemblies allow for a common sensor circuit to be affixed to one of multiple electrical conductors having a large variety of external dimensions and sizes by simply selecting and coupling the sensor circuit to the clip assembly that is configured to be affixed to the size of the particular electrical conductor where the sensor circuit is intended to be installed.

In various example, one or more sensor circuits may be packaged or otherwise provided as a kit that includes a plurality of clip assemblies, the clip assemblies including clip assemblies configured to be affixed to a plurality of different size ranges of electrical conductors. For example, the kit may include one or more clip assemblies configured to be affixed to electrical conductors having a first size range, and one or more clip assemblies configured to be affixed to electrical conductors having a second size range that is different from the first size range. In various examples, the clip assemblies provided with the kit may be designated, for example using different colors and/or by markings, that are indicative of the range of sizes of electrical conductors each clip assembly is configured to be affixed to. The sensor circuit as provided in the kit is mechanically couplable to each of the clip assemblies provided in the kit, thus allowing each sensor circuit to be coupled to a variety of clip assemblies and thus to a variety of different electrical conductors have a varied range of sizes.

In various examples, clip members 124A, 124B are configured to be resiliently flexible in the directions indicated by arrows 131, 132, respectively, wherein each clip member 124A, 124B is configured to remain secured to clip attachment block 122 in a fixed position, but to flex along the length of the clip member between the clip attachment block and the distal ends, 126A, 126B, respectively. Flexation of the clip members 124A, 124B allow insertion of a portion of an electrical conductor 150 through the opening 128 and into the retention area 130, as represented by arrow 155. When an electrical conductor 150 is moved toward opening 128, as represented by arrow 155, the distal ends 126A, 126B are configured to contact the electrical conductor, and to urge clip members 124A, 124B to be flexed in the outward direction indicated by arrows 131 132, respectively, to increase a dimension of opening 128 between distal ends 126A and 126B. Enlargement of the dimension of opening 128 allows the electrical conductor 150 to pass through opening 128 and into retention area 130. Once the electrical conductor 150 has passed through opening 128 and is received in the retention area 130 to an extent that the electrical conductor is no longer exerting a force against the distal ends 126A, 126B, the resilient properties of clip members 124A, 124B will urge clip members 124A, 124B back to a position such that the dimension of opening 128 between distal ends 126A, 126B is reduced. At some point, electrical conductor 150 will contact each of clip members 124A, 124B, such that some portion of interior surfaces 124C, 124D of clip member 124A, 124B, respectively, will be in contact with and are configured to exert a force on the portion of electrical conductor 150 that is between the clip members 124A, 124B and within retention area 130, the force in a direction that would urge distal ends 126A, 126B to move in a direction closer to one another.

By exerting a force on the portion of electrical conductor 150 within retention area 130, clip members 124A, 124B are configured to secure the clip assembly 120 to the portion of the electrical conductor 150 received in retention area 130. The force exerted on the electrical conductor 150 by clip member 124A, 124B is configured to be adequate to prevent the clip assembly, and thus the housing 110, from being moved along the electrical conductor in a direction of a longitudinal axis of the electrical conductor 150 (e.g., an axis of electrical conductor 150 looking into the drawing as electrical conductor 150 is illustrated in FIG. 2A) by forces such as gravity or small vibrational forces that may occur along electrical conductor 150. In various examples, clip members 124A, 124B comprise a spring member 124E, for example a metal spring sheet, that is embedded within or is otherwise in contact with the clip members, for example along some portion of the interior or the exterior surfaces of clip members 124A, 124B. In some examples, spring member 123E is formed from a material, such as a metal (e.g., copper) that is flexible and ales acts to concentrate the electromagnetic field generated by a conductor received I the clip assembly. The spring member is configured to urge the clip members 124A, 124 in a direction toward one another, and in some examples is configured to provide the clamping force exerted by the clip members 124, 124B on the portion of the electrical conductor received in the retention area 130.

In this matter, the clip assembly 120 can easily be inserted onto a portion of the electrical conductor 150 without having to provide an electrical coupling between the probe 100 and the electrical conductor 150, or to otherwise alter the position or any other physical properties of the electrical conductor 150 in order to secure the clip assembly 120, and thus the probe 100, to a portion of the electrical conductor. Further, because the clip assembly 120 and the housing 110 are configured to position the sensor circuit 101 adjacent to and at a predetermined distance or within a predetermined range of distances relative to the electrical conductor 150 when the probe is secured to the electrical conductor, by selection of the proper clip assembly and the housing, the sensor circuit 101 is physically located at a position affixed and adjacent to the electrical conductor and at a distance from the electrical conductor to allow sensor circuit 101 to sense a current flow though electrical conductor 150.

As shown in FIG. 2A, electrical conductor 150 is illustratively shown as a cross-section of an electrically conductive element 152 surrounded by an insulative layer 154, the electrical conductor having substantially a round cross-section. As would be understood by one of ordinary skill in the art, electrical conductors are commonly formed in this manner, comprising a cylindrical shaped electrically conductive element, such as wire formed of a conductive material such as copper or aluminum, having a predetermined cross-sectional dimension, and an unspecified length. In various examples, the conductive element 152 of the electrical conductor 150 comprises multiple conductors, such as strands of wires, formed into one or more bundles and having generally a cylindrical shape with a nominal cross-dimensional width or thickness and an unspecified length. In some examples, the electrically conductive element may or may not be cover by a layer of insulated material, and may be a "bare" wire or "bare" bundle of strands of wire. In various examples, clip members 124A, 124B are configured to flexibly attach and be detachable to a range of variations in sizes of electrical conductors, with or without the insulated layer, having a particular range of cross-sectional diameters. In various examples, clip assembly 120 is provided in a plurality of clip assembly sizes, wherein different ones of the clip assemblies are configured to be attachable (and detachable) from a different range of cross-sectional dimensions for electrical conductors. In this manner, a clip assembly that is configured to clip onto an electrical conductor having a particular cross-sectional diameter can be selected, and attached to housing 110 in order to allow the housing 110 and sensor circuit 101 to be attached to the particular electrical conductor, allowing housing 110 and sensor circuit 101 to be attached to a wide variety of electrical conductors having different cross-sectional areas.

Further, it is not necessary that the interior surfaces 124C, 124D of clip member 124A, 124B, respectively be in contact with the electrical conductor (e.g., electrical conductor 150) along the entire interior surfaces of clip members 124A, 124B, or that the shape formed by the retention area 130 and interior surfaces 124C, 124D are symmetrical with the exterior dimensions and shape of electrical conductor 150. In various examples, only some portion of interior surfaces 124C and 124D are required to contact the portion of electrical conductor received in retention area 130 in order to adequacy secure the sensor circuit of probe 100 in a position affixed and adjacent to and at a proper distance for the electrical conductor to allow sensor circuit 101 to sense current flows through the electrical conductor. In various examples, in addition to making contact with interior surfaces 124C, 124D of clip member 124A, 124B, respectively, clip assembly block 122 may also be in contact with the electrical conductor, and thus aid in the retention of probe 100 in the position affixed and adjacent to the electrical conductor received in retention area 130.

Once probe 100 is installed onto electrical conductor 150 as described above, sensor circuit 101 may be operated to sense current flow through electrical conductor 150, and to wirelessly transmit data, the data including data indicative of the level of current flows through electrical conductor 150, as described herein. In various examples, sensor circuit 101 is configured to sense other parameters, such as but not limited to temperature, and to wirelessly transmit data indicative of these other sensed parameters, as further described herein. In addition, probe 100 may be quickly and easily unclipped (removed) from electrical conductor by pulling probe 100 away from electrical conductor 150 so that electrical conductor exerts a force on distal ends 126A, 126B to enlarge the dimension of opening 128, and allowing electrical conductor 150 to be removed from retention area 130. Removal of probe 100 does not require an electrical disconnection of probe 100 from electrical conductor 150 because probe 100 was never electrically coupled to electrical conductor 150, and was not require to be electrically coupled to electrical conductor 150 in order to monitor current flows through electrical conductor 150. In addition, because clip assembly 120 is only attached to electrical conductor 150 by virtue of the clamping force exerted on the exterior of electrical conductor 150 by clip members 124A, 124B, and without the need to otherwise physically alter electrical conductor 150, removal of probe 100 from electrical conductor 150 can be accomplished without the need to physically alter the electrical conductor 150, or to otherwise disturb or alter electrical conductor 150 in any significant manner.

Figure 2B:
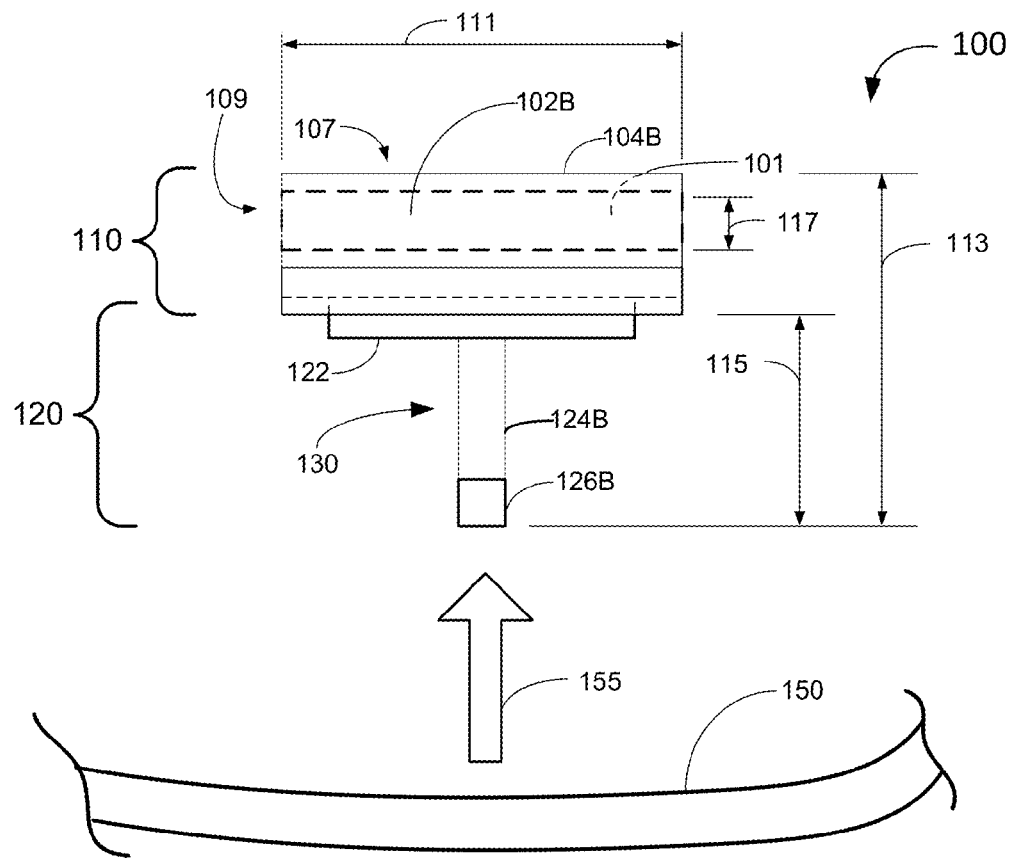
FIG. 2B is a side view of a power monitoring probe according to various examples described herein.

FIG. 2B is a side view of a power monitoring probe 100 according to various examples described herein. As illustrated, probe 100 comprises housing 110 and clip assembly 120 as illustrated and as previously described above with respect to FIG. 2A, now turned to view probe 100 from a side view including side 102B, clip member 102B, and distal end 126B. As shown in FIG. 2B, sensor circuit 101 is enclosed within the partial cavity formed by top surface 106A, sides 102A, 102B, and retention lips 104A, 104B. In various examples, sensor circuit 101 may have been inserted into housing 110 through open end 109, or may have been inserted into housing 110 though top area 107 of the housing. As previously described, clip assembly 120 is mechanically coupled to housing 110 by clip assembly block 122. Clip assembly 120 is configured to receive illustrative electrical conductor 150, as illustrated by arrow 155, in the retention area 130 of the clip assembly. As previously described, clip assembly 120 is configured to attach probe 100 to an electrical conductor, such as electrical conductor 150, in a manner so the probe 100 can also be quickly and easily detached from the electrical conductor.

In various examples, housing 110 and sensor circuit 101 have a depth dimension 111 of 6 mm to 8 mm. In various examples, the clip assembly 120 has an overall height dimension 115 in a range of 5 mm to 8 mm. In various examples, the housing 110 and the clip assembly 120, when mechanically coupled, have an overall height dimension 113 in a range of 7 mm to 16 mm. In various examples, sensor circuit 101 has a height dimension in a range of 5 mm to 8 mm.

Figure 2C:
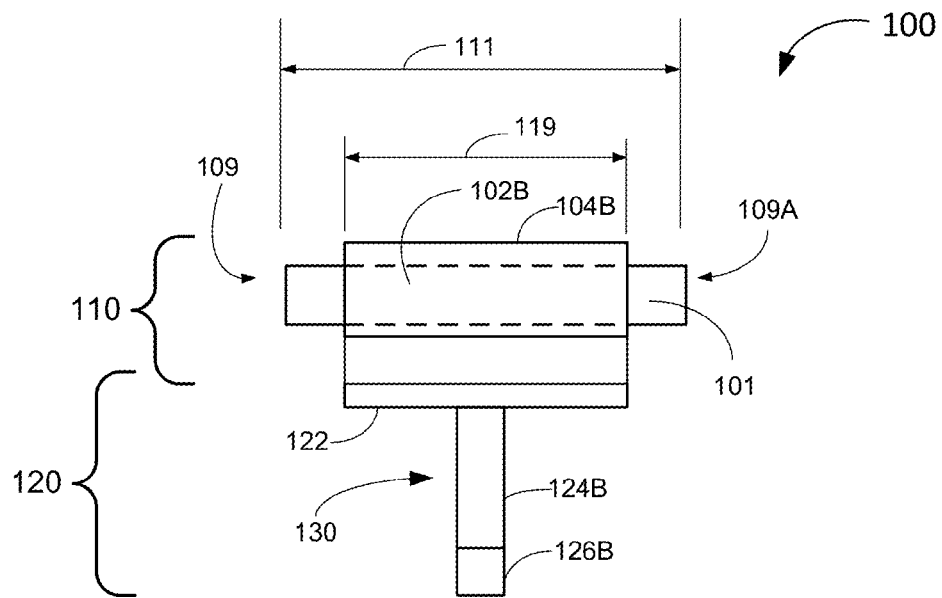
FIG. 2C is another side view of a power monitoring probe according to various examples described herein.

FIG. 2C is another side view of a power monitoring probe 100 according to various examples described herein. As illustrated, sensor circuit 101 has a depth dimension 111 that is larger than a depth dimension 119 of the housing 110. As such, sensor circuit 101 extends, for example beyond open end 109, and/or open end 109A of housing 110. In this example, housing 110 provides a tunnel-like structure having a depth dimension 119 that is less than a depth dimension 1111 of the sensor circuit 101.

Figure 2D:
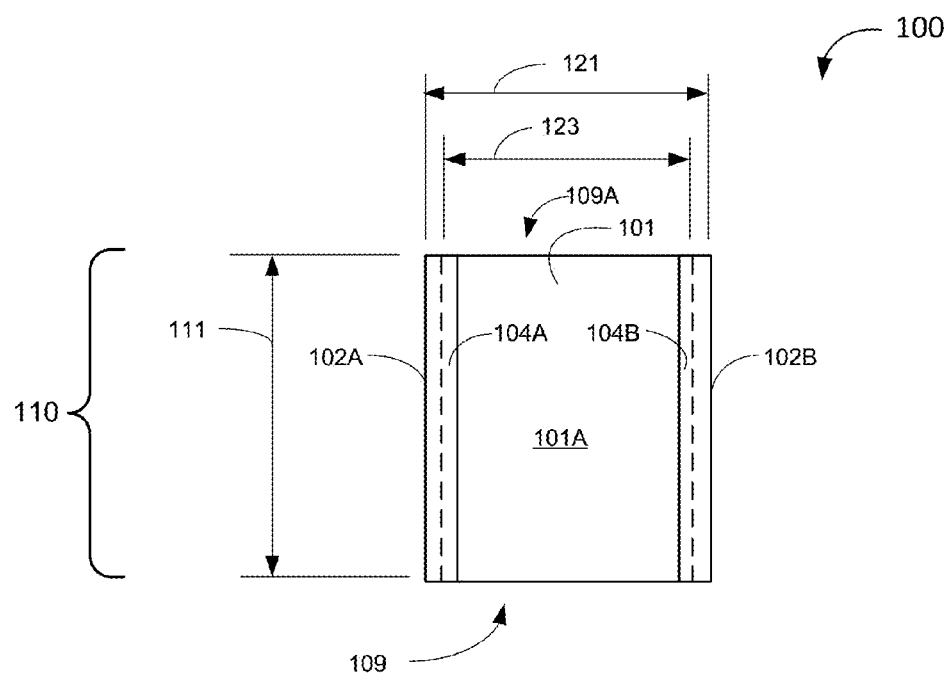
FIG. 2D is a top view of a power monitoring probe according to various examples described herein.

FIG. 2D is a top view of a power monitoring probe 100 according to various examples described herein. As illustrated, sensor circuit 101 is shown as received in housing 110 and contained between sides 102A and 102B. Retention lips 104A and 104B overlap a portion of the top surface 101A of sensor circuit 101, further securing sensor circuit 101 within housing 110. As described above, housing 110 and sensor circuit 101 in some examples have a depth dimension 111 of about 6 mm. In various examples, housing 110 has an overall width dimension 121 in a range of 5 mm to 6 mm. In various examples, the spacing between sides 102A and 102B configured to receive sensor circuit 101 has a dimension 123 in a range of 3 mm to 8 mm.

Figure 2E:
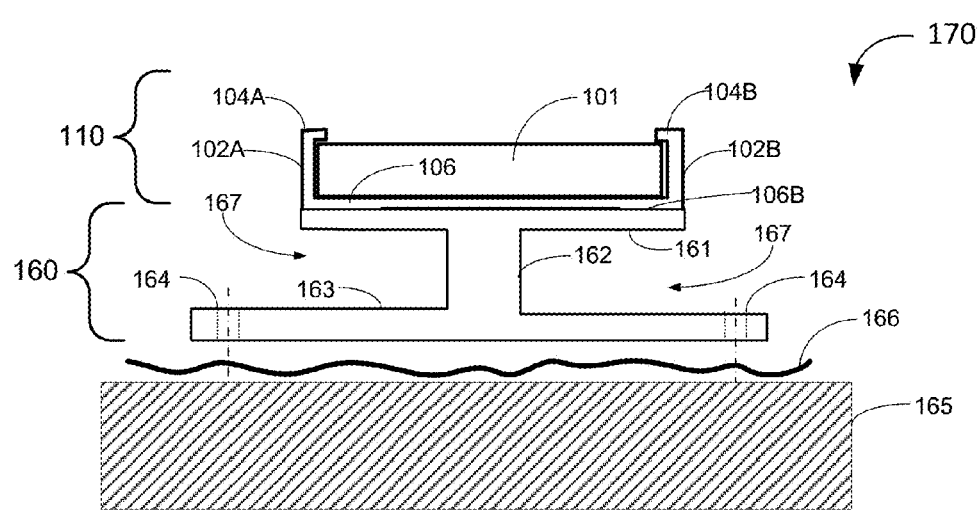
FIG. 2E is a side view of a power monitoring probe according to various examples described herein.

FIG. 2E is a side view of power monitoring probe 170 according to various examples described herein. As illustrated, probe 170 comprises a sensor circuit 101, a housing 110, and an attachment assembly 160. Sensor circuit 101 is not limited to any particular type of sensor circuit, and may comprise any of the sensor circuits described herein, or the equivalents thereof. Sensor circuit 101 is secured by housing 110, wherein housing 110 is mechanically coupled to attachment assembly 160. Housing 110 is not limited to any particular arrangement for securing sensor circuit 101, and may for example secure sensor circuit 101 using any of the arrangements described above with respect to housing 110 and FIGS. 2A-2D. In FIG. 2E housing 110, instead of having coupling fingers 108 to secure the clip assembly 120 to housing 110, comprises the attachment assembly 160, as illustrated in FIG. 2E, mechanically coupled to a bottom surface 106B of housing 110. In various examples, attachment assembly 160 is mechanically coupled to the bottom surface 106B of housing 110 using an adhesive (not shown in FIG. 2E). In various examples, attachment assembly 160 is mechanically coupled to the bottom surface 106B of housing 110 using one or more fasteners, such as a retaining clip or screws (not shown in FIG. 2E). In various examples, attachment assembly 160 is formed as a same piece as at least the bottom portion 106 of housing 110, and thus is "mechanically coupled" to housing 110 by virtue of being a continuation of the piece or material forming housing 110.

As illustrated, attachment assembly 160 includes a top flange 161 coupled to a first end of an upright portion 162, and a bottom flange 163 coupled to a second end of the upright portion 162, the second end opposite the first end of the upright portion. The top flange 161 forms a planar surface operable to contact or be formed as part of the bottom 106 of the housing. The bottom flange 163 forms a planar surface that extends parallel to the top flange 161, and extends outward beyond the edges of the top flange 161. In various examples, upright portion 162 coupled to both the top flange 161 and the bottom flange 163 is a perpendicular plane, and spaces the top flange 161 from the bottom flange 163 to generate spaces 167 between the top flange 161 and the bottom flange 163. In various examples, bottom flange 163 comprises one or more through holes 164. Through holes 164, when provided, allow a fastener, such as a screw or a rivet (not shown in FIG. 2E) to be used to secure bottom flange 163, and thus probe 170, to a block 165. In various examples, instead of or in addition to using fasteners, bottom flange 163 may be mechanically secured to block 165 using an adhesive layer 166 provided between the block 165 and the bottom flange 163. In various examples, adhesive layer 166 is a material, such as silicon grease, that is conductive of electromagnetic wave energy. In various examples, block 165 is a block of material, such as an electrical bus bar, a ground buss, or a terminal block, that is provided as part of an electrical circuit, and acts as an electrical conductor within the electrical circuit.

When attached to block 165, probe 170 may be configured to monitor a current flowing through block 165, and to wirelessly transmit data indicative of the levels of current flowing in block 165 to one or more external devices (not shown in FIG. 2E). In various examples, the spacing provided by spaces 167 that position sensor circuit 101 adjacent to and at a predetermined distance or within a predetermined range of distances from block 165 are dimensioned to allow sensor circuit 101 to properly sense the level of current flowing though block 165. In various examples, sensor circuit 101 is configured to sense additional parameters, such as temperatures, and to wirelessly transmit data indicative of the sensed additional parameters to one or more external devices (not shown in FIG. 2E).

Figure 2F:
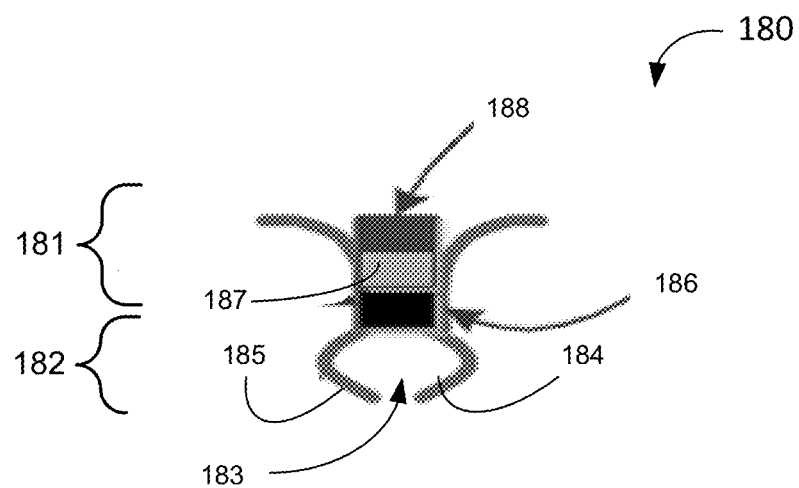
FIG. 2F is a side view of a power monitoring probe according to various examples described herein.

FIG. 2F is a side view of power monitoring probe 180 according to various examples described herein. As illustrated, probe 180 comprises a housing 181 and a clip assembly 182 mechanically coupled to the housing 181. Clip assembly 182 comprises clip members 184, 185, which are flexibly resilient, and partially enclose a retention area 183. Clip members 184, 185 are configured to flex outwardly away from each other to allow a portion of an electrical conductor to be received in retention area 183. When a portion of the electrical conductor has been fully received in retention area 183, clip members 184 and 185 are configured to flex back inward toward one another until clip members 184 and 185 contact the portion of the electrical conducted received in area 183 with a clamping force configured to detachably attached probe 180 to the electrical conductor.

Housing 181 of probe 180 comprises three separate positions, vertically stacked one above the other, a first position closest to the clip assembly, a second position above the first position, and a third position above the second position and located farthest away from the clip assembly. In probe 180, a sensor circuit 186, a wireless transmission circuit 187, and a battery 188 are provided as separate devices that are electrically coupled to one another. Sensor circuit 186 in various examples comprises any of the examples of sensor circuit 101 illustrated and described above with respect to FIGS. 2A-2E. As illustrated in FIG. 2F, sensor circuit 186 is located in the first position of housing 181, wireless transmission circuit 187 is located at the second position of housing 181 and above the sensor circuit 186 relative to the clip assembly 182. In addition, battery 188 is located in the third position of housing 110, which places battery 188 above both wireless transmitter 187 and sensor circuit 186. One advantage of this arrangement is that it allows access to battery 188, including access to change the battery in probe 180, without having to move or otherwise physically disturb the sensor circuit 186 and the wireless transmitter 187 relative to these devices' positions in the housing 181.

Figure 2G:
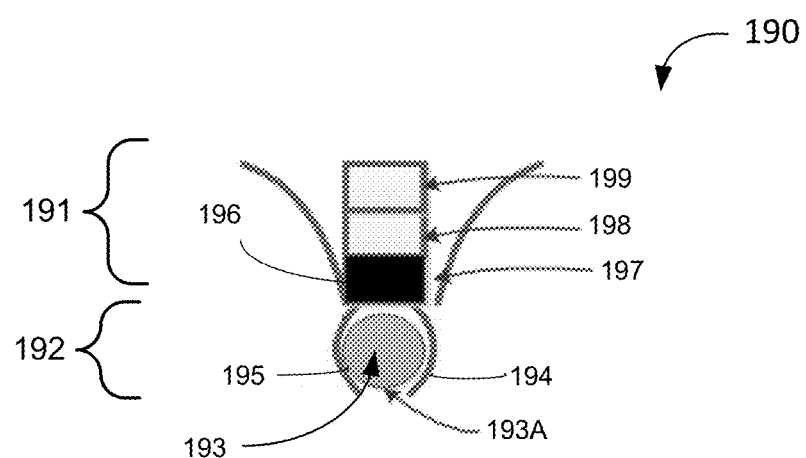
FIG. 2G is a side view of a power monitoring probe according to various examples described herein.

FIG. 2G is a side view of a power monitoring probe 190 according to various examples described herein. As illustrated, probe 190 comprises a housing 191 and a clip assembly 192 mechanically coupled to the housing 191. Clip assembly 192 comprises clip members 194, 195, which are flexibly resilient, and partially enclose a retention area 193. As illustrated in FIG. 2G, an electrical conductor 193A has been received in the retention area 193. Clip members 184, 185 are configured to flex outwardly away from each other to allow a portion of an electrical conductor to be received in retention area 193. When a portion of the electrical conductor has been fully received in retention area 193 as illustrated with respect to electrical conductor 193A, clip members 194 and 195 are configured to flex back inward toward one another until clip members 194 and 195 contact the portion of the electrical conductor 193A received in retention area 193 with a clamping force configured to detachably attach probe 190 to the electrical conductor 193A.

Housing 191 of probe 190 comprises three separate positions, 197, 198, and 199, vertically stacked one above the other, the first position 197 closest to the clip assembly, the second position 198 above the first position 197, and a third position 199 above the second position 198 and located farthest away from the clip assembly 192. In probe 190, a sensor circuit, a wireless transmission circuit, and a battery are all provided as a single device 196, wherein device 196 is dimensioned so that device 196 can be positioned at any one of positions 197, 198, or 199. Device 196 in various examples comprises any of the examples of sensor circuit 101 illustrated and described above with respect to FIGS. 2A-2E. As illustrated in FIG. 2G, device 196 is located in the first position 197 of housing 191. In this position, the sensor circuit of device 196 may be most sensitive to detection of current flows through electrical conductor 193A. Positioning of device 196 at position 197 in some examples may be chosen when the current sensing application requires sensing current in a low level current range, for example in a range of 0 to 30 amps. In other examples, device 196 may be positioned at the second position 198, or in the alternative at the third position 199. Positioning of the device 196 at the second position 198 may be chosen when the current sensing application requires sensing currents in a mid-level current range, for example a range of 0 to 50 amps. Positioning of the device 196 at the third position 199 may be chosen when the current sensing application required sensing currents in a high level current range, for example is a range of 0 to 100 amps. One advantage of this arrangement is that it allows device 196 to be used in a variety of different sensing operations that require different levels of sensitivity, but wherein the sensor circuitry of device 196 comprises a fixed or a preset range of sensitivities related to current sensing.

In various examples, device 196 may be calibrated to with respect to the measurement of the current flowing through conductor 193 using a calibration procedure. For example, one or more known levels of current flow may be provided through electrical conductor 193A. As each known level of current flow is provided through electrical conductor 193A, device 196 is triggered to sense the current flow, and to transmit data corresponding to the sensed current flow. The data provided by device 196 corresponding to the sensed current flow can then be compared to the known current flow value, and a calibration adjustment parameter or parameters, if needed, can be determined to adjust the device 196 so that the sensed current flow provided by device 196 when the known current flow is provided through electrical conductor 193A matches the value of the known current flow. In various examples, the calibration adjustment parameters may be wirelessly transmitted to device 196, wherein device 196 may receive the calibration adjustment parameters, and apply these calibration adjustment parameters to the sensed current measurement further taken when sensing the current flows through electrical conductor 193A.

Figure 2H:
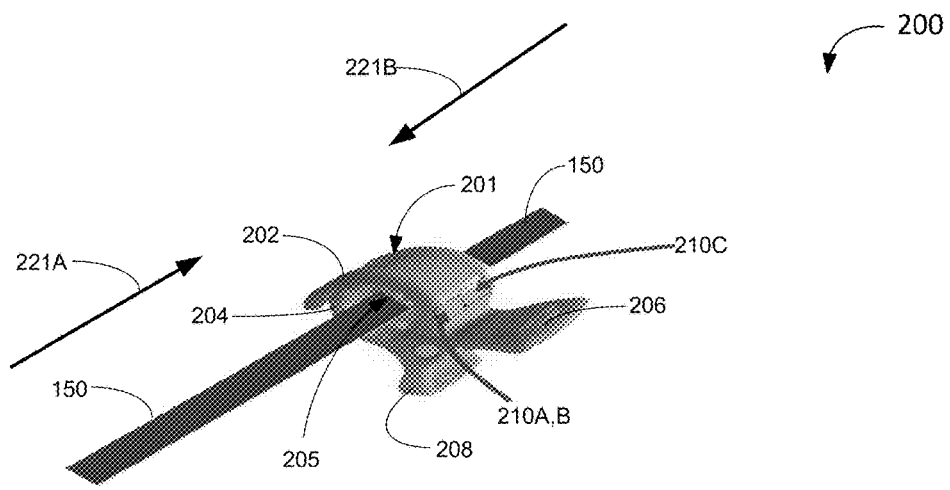
FIGS. 2H, 2J, and 2K are various views of a power monitoring probe 200 according to various examples described herein.
Figure 2J:
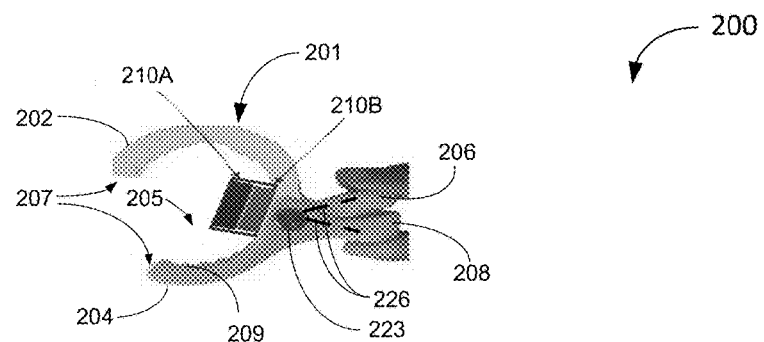
Figure 2K:
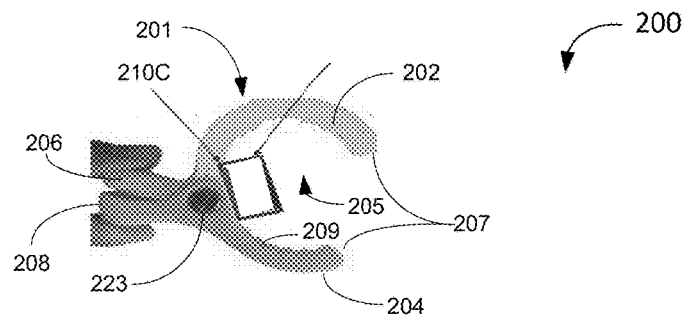

FIGS. 2H, 2J, and 2K are various views of a power monitoring probe 200 according to various examples described herein. FIG. 2H illustrates a perspective view of power monitoring probe 200 and an illustrative example conductor 150 that power monitoring probe 200 is configured to be affixed to. FIG. 2J illustrates a first side view of power monitoring probe 200 (looking toward power monitoring probe 200 in a direction shown by arrow 221A in FIG. 2H), and FIG. 2K illustrates a second side vie of power monitoring probe 200, (looking toward power monitoring probe 200 in a direction shown by arrow 221B in FIG. 2H).

As illustrated in FIG. 2H, probe 200 comprises a clip assembly 201 comprising a first clip member 202 including a first clip handle 206, the first clip member 202 mechanically coupled to a second clip member 204, the second clip member 204 including a second clip handle 208. First clip member 202 and second clip member 204 form a partially enclosed retention area 205 that is configured to receive a conductor, such as illustrative example conductor 150, within retention area 205, and to exert a force on the portion of the conductor received in retention area 205 in order to affix the power monitoring probe 200 to the conductor. The first clip member 202 mechanically coupled to the second clip member 204 such that the clip member 202, 204 may be urged, for example by pressing first clip handle 206 and second clip handle 208 toward one another, thus enlarging the retention area 205 partially enclosed by the first clip member 202 and second clip member 204, allowing clip assembly 201 to receive a portion of a conductor, such as illustrative exampled conductor 150, into retention area 150.

When a force urging first clip handle 206 and second clip handle 208 toward one another is no longer being exerted on these clip handles, clip assembly 201 is configured to exert a force, such as a spring force, that urges first clip member 201 and second clip member 204 toward each other in order to reduce the size of eh partial area enclosed within retention area 205. When clip assembly 201 urges the clip members 202, 204 toward each other in this manner, and a portion of a conductor, such as illustrative conductor 150 has been fully received within retention area 150, the clip members 202 and 204 are configured to completely or partially surround an outside circumference or dimension of the portion of conductor 150 received in the retention area 150, and to exert a force on the portion of the conductor 150 received in the retention area 205 in order to affix clip assembly 201 to the conductor 150. The force exerted on the portion of conductor 150 received in retention area 205 by clip assembly 201 may be provided for example by a spring (as shown in FIG. 2J) embedded within or otherwise coupled to one or both of the first and second clip members 202, 204, respectively.

As shown in FIG. 2H, clip assembly 200 further comprises a sensor circuit 201 mechanically coupled to the clip assembly 200 in a manner that allows sensor circuit to be located adjacent to a conductor, such as illustrative conductor 150, when clip assembly 200 is affixed to the conductor. Sensor circuit 201 is not limited to any particular type of sensor circuit, and in various examples may be any of the sensor circuits 101 described with respect to FIGS. 2A-2E. In various example, sensor circuit 201 include a sensor 210A configured to sense electrical current, and to provide an output signal corresponding to the sensed electrical current, and a wireless transmission circuit 210B, operable to receive the output signal from the sensor 210A, and to wirelessly transmit data to one or more external devices (not shown in FIG. 2H), the data comprising data and other information related to the electrical current sensed by sensor 210A. In various examples, sensor circuit 210 includes a battery configured to provided power for the operation of sensor circuit 210A and wireless transmission circuit 201B. In alternative examples, sensor circuit 210 includes a power harvesting circuit 210C that is configured to harvest power from the conductor, such as illustrative conductor 150, to which power monitoring probe 200 is attached, and thus eliminate the need to provide a battery, or to allow for the use of a recharging battery or other type of device capable of storing electrical energy, such as a capacitor, provided by the power harvesting circuit and available for providing the electrical power needed to operate sensor circuitry 210.

FIG. 2J illustrates a first side view of power monitoring probe 200. As illustrated, first clip member 202 and second clip member 204 comprise and opening 207 that allow a portion of a conductor to pass through the opening 207 and to be received in retention area 205. As shown in FIG. 2J, first clip handle 206 and second clip handle 208 have been actuated toward one another, causing a rotational force centered around pin 223, to cause a dimension of the opening 207 between first clip member 202 and second clip member 204 to be enlarged to allow for insertion of a portion of conductor, such as conductor 150 and as illustratively shown as conductor 150, into retention area 205. Once the portion of the conductor is received in retention area 205, a spring force, represented by spring 226, embedded or otherwise mechanically coupled to clip assembly 201 is configured to urge first clip member 202 and second clip member 204 toward each other so that the clip members 202, 204 exert a force on the portion of the conductor received in retention area 205 in a manner to affix clip assembly 201 to the conductor. In various examples, one or both of clip members 202, 204 may comprise ridges or other formations on the interior surface of the clip member that faces toward the conductor, the ridges or other formations illustrated as ridges 209, and that are configured in a manner to help clip assembly 201 exert a retentional force on the portion of the conductor brought into contact with clip members 202, 204. As would be understood by one or ordinary skill in the art, when a conductor is fully received in retention area 205, sensor circuit 210, comprising any examples of sensor circuit 210 as described above, is brought into a location adjacent to the conductor, and thus may be configured to sense one or more parameters associated with the electrical conductor, such as but not limited to current flow through the conductor. In the side view illustrated in FIG. 2J, the sensor circuit 210A would be immediately adjacent to the conductor received in retention area 205, and the wireless transmission circuit 210B may be immediately adjacent to the sensor circuit 210A.

FIG. 2J illustrates a second side view of power monitoring probe 200. As illustrated, first clip member 202 and second clip member 204 comprise and opening 207 that allow a portion of a conductor to pass through the opening 207 and to be received in retention area 205. As shown in FIG. 2K, first clip handle 206 and second clip handle 208 have been actuated toward one another, causing a rotational force centered around pin 223, to cause a dimension of the opening 207 between first clip member 202 and second clip member 204 to be enlarged to allow for insertion of a portion of conductor into retention area 205 is a manner described above with respect to FIG. 2J. When a conductor is fully received in retention area 205, sensor circuit 210, comprising any examples of sensor circuit 210 as described above, is brought into a location adjacent to the conductor, and thus may be configured to sense one or more parameters associated with the electrical conductor, such as but not limited to current flow through the conductor. In the side view illustrated in FIG. 2K, in various examples sensor circuit 210 comprises a power harvesting circuit 210C arranged so that when a conductor is received in retention area 205, the power harvesting circuit 201C would be brought into a positon adjacent to the portion of the conductor received in retention area 205, and the power harvesting circuit may be located immediately adjacent to conductor.

Figure 2L:
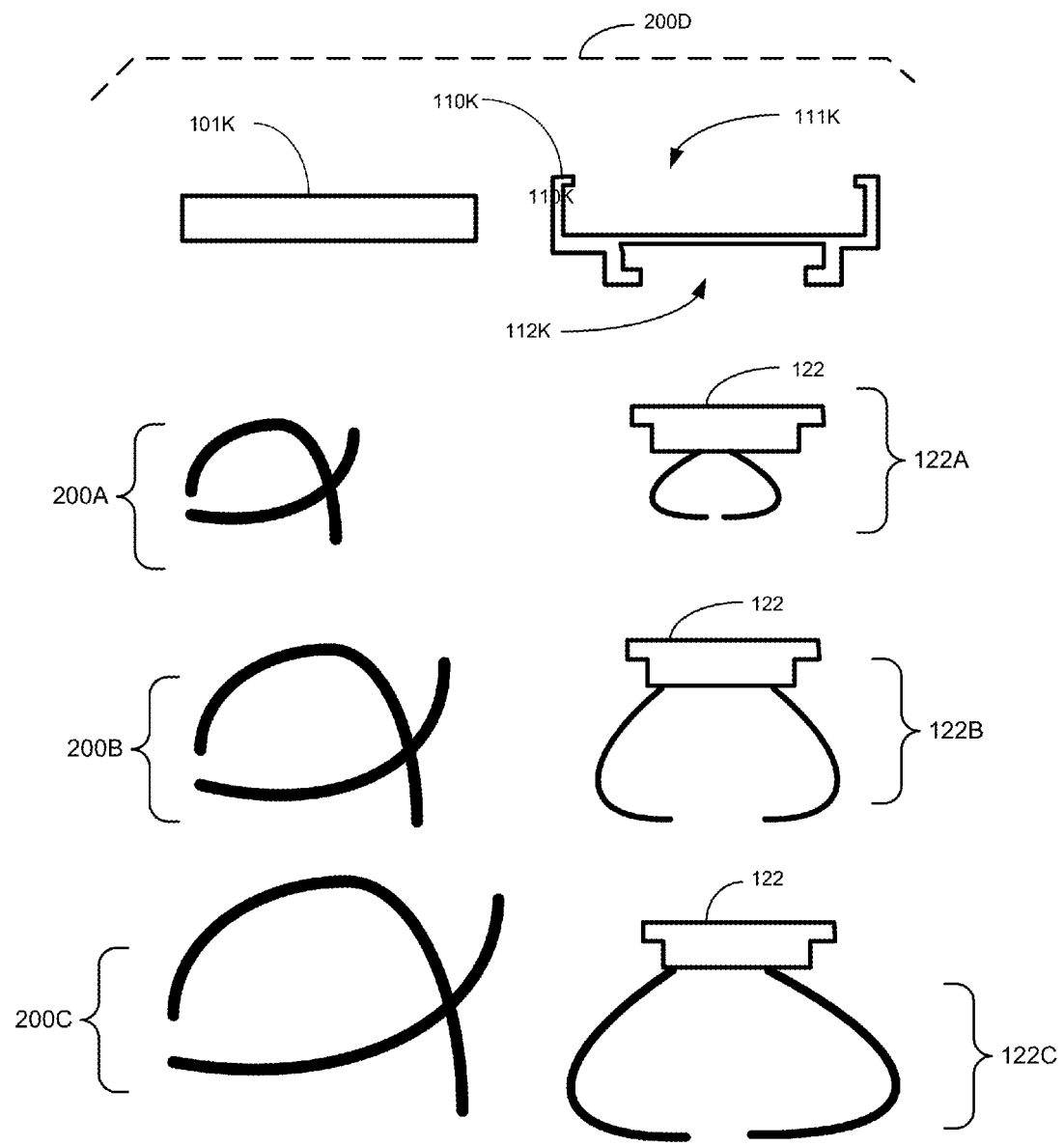
FIG. 2L illustrates a kit according to various examples described herein.

FIG. 2L illustrates a kit 200D according to various examples described herein. As illustrated, kit 200D comprises a sensor chip 101K, a housing 110K, and a plurality of clip assemblies comprising illustrative clip assemblies 122A-C and/or illustrative clip assemblies 200A-C. Sensor chip 101K may be sensor chip 101 as described above, and may include any of the features and provide any combination of the function described herein for sensor chips. Housing 110K in some examples is housing 110 as described above, may be configured to provide any of the feature and to perform and of the functions described with respect to housing 110. Clip assemblies 122A-C each include a block 122A-C, respectively, wherein block 122 is configured to be coupled to housing 110K in a same manner as previously described with respect to housing 110 and sensor chip 101. However, each of clip assemblies 122A-C comprises clip members that are configured to be affixed to a different, and in some instances an overlapping range of sizes of electrical conductors. For example, clip assembly 122A is configured to be affixed to a range of electrical conductors having an exterior dimension that is smaller than the size range of electrical conductors that clip assembly 122B is confined to be affixed to. Clip assembly 122C is configured to be affixed to a range of electrical conductors having an exterior dimension that is larger than the size range of electrical conductors that clip assembly 122B is configured to be coupled to. Thus, by using kit 200D, in some examples sensor circuit 101 may be received in area 111K of housing 110K, and a selected one of the clip assembles 122A-C may be chosen to be coupled though block 122 to housing 110K by receiving block 122 of the chosen clip assembly at area 112K of housing 110K. In this manner, a same sensor chip and a same housing may be coupled to a wide variety of electrical conductors having a range of exterior dimensions using the parts provided by kit 200D.

In an alternative example, kit 200D may include a set of clip assemblies 200A-200C, wherein clip assemblies 200A-200C comprise clip assemblies having a spring-tensioned clipping mechanism, such as he clipping arrangement described above for clip assembly 201. Each of clip assemblies 200A-C is configured to be clipped to (affixed to) a range of electrical conductors having different, and in some examples an overlapping range of external dimensions. For example, clip assembly 200A is configured to be affixed to a range of electrical conductors have an exterior dimension that is smaller than the size range of electrical conductors that clip assembly 200B may be confined to be affixed to. Clip assembly 200C is configured to be affixed to a range of electrical conductors having an exterior dimension that is larger than the range of electrical conductors that clip assembly 200B is configured to be coupled to. In addition, each of clip assemblies 200A-C is configured to receive a senor chip, such as sensor chip 101K, and to secure the senor chip within in the clip assembly. In this manner, choosing one of clip assemblies 200A-C from kit 200D allow for coupling sensor chip 101K to a wide variety of electrical conductors having a range of different external dimensions. In various examples of kit 200D, both types of clip assemblies represented by clip assemblies 122A-C and clip assemblies 200A-C may be provided, in various quantities of each clip assembly, and for each size of each types of clip assembly provided in the kit. In various examples, a sensor chip 101K is not provided with kit 200D.

Figure 3:
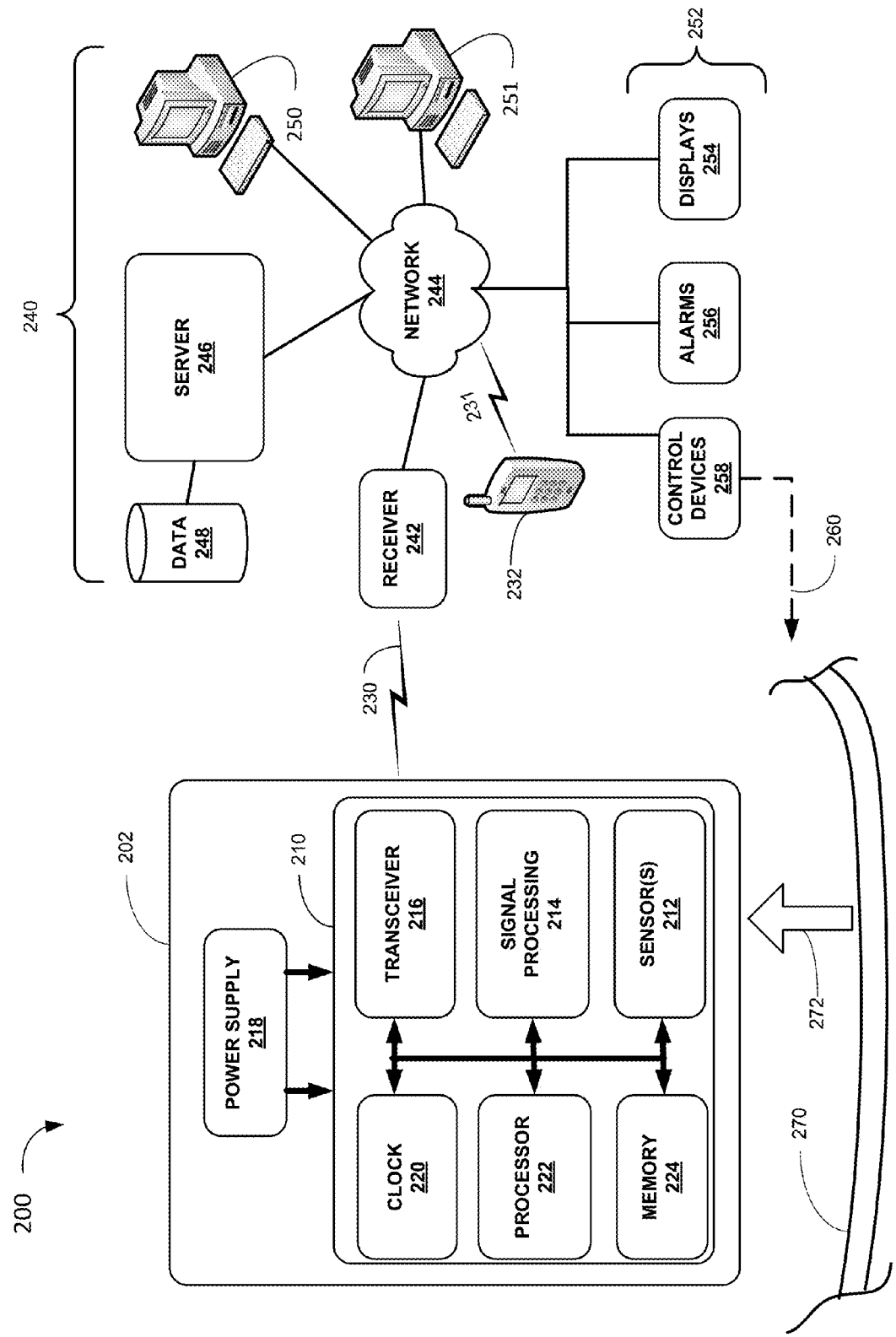
FIG. 3 is a block diagram illustrating an example electrical power distribution system comprising a power monitoring probe according to various examples described herein.

FIG. 3 is a block diagram illustrating an example electrical power distribution system 200 comprising a power monitoring probe according to various examples described herein. As illustrated, system 200 includes a probe 202 communicatively coupled to external devices 240. Probe 202 is configured to be located adjacent to and within a predetermined distance (illustrated by arrow 272) of a portion of illustrative electrical conductor 270, and to sense one or more parameters related to electrical conductor 270, including a current flow through electrical conductor 270. In various examples, probe 202 is configured to sense an ambient temperate in the vicinity of probe 202. Probe 202 is not limited to a particular type of probe, or a probe having a particular physical configuration. In various examples, probe 202 is any of the probes 26-33 and 54-61 illustrated in and described with respect to FIG. 1, probe 100 as illustrated in and as described with respect to FIGS. 2A-2D, probe 170 as illustrated in and described with respect to FIG. 2E, probe 180 as illustrated in and as described with respect to FIG. 2F, or probe 190 as illustrated in and as described with respect to FIG. 2G. In addition, while only one probe 202 is illustrated in FIG. 3, system 200 is not limited to comprising a single probe, and may comprise a plurality of probes, such as described above with respect to system 10 and as illustrated in FIG. 1.

Referring again to FIG. 3, probe 202 of system 200 is configured to wirelessly transmit data or other information, represented by lightning bolt 230, to external devices 240. The format for the wireless communications from probe 202 to external devices 240 is not limited to any particular format, and may include any of the wireless transmission formats described herein.

Figure 3A:
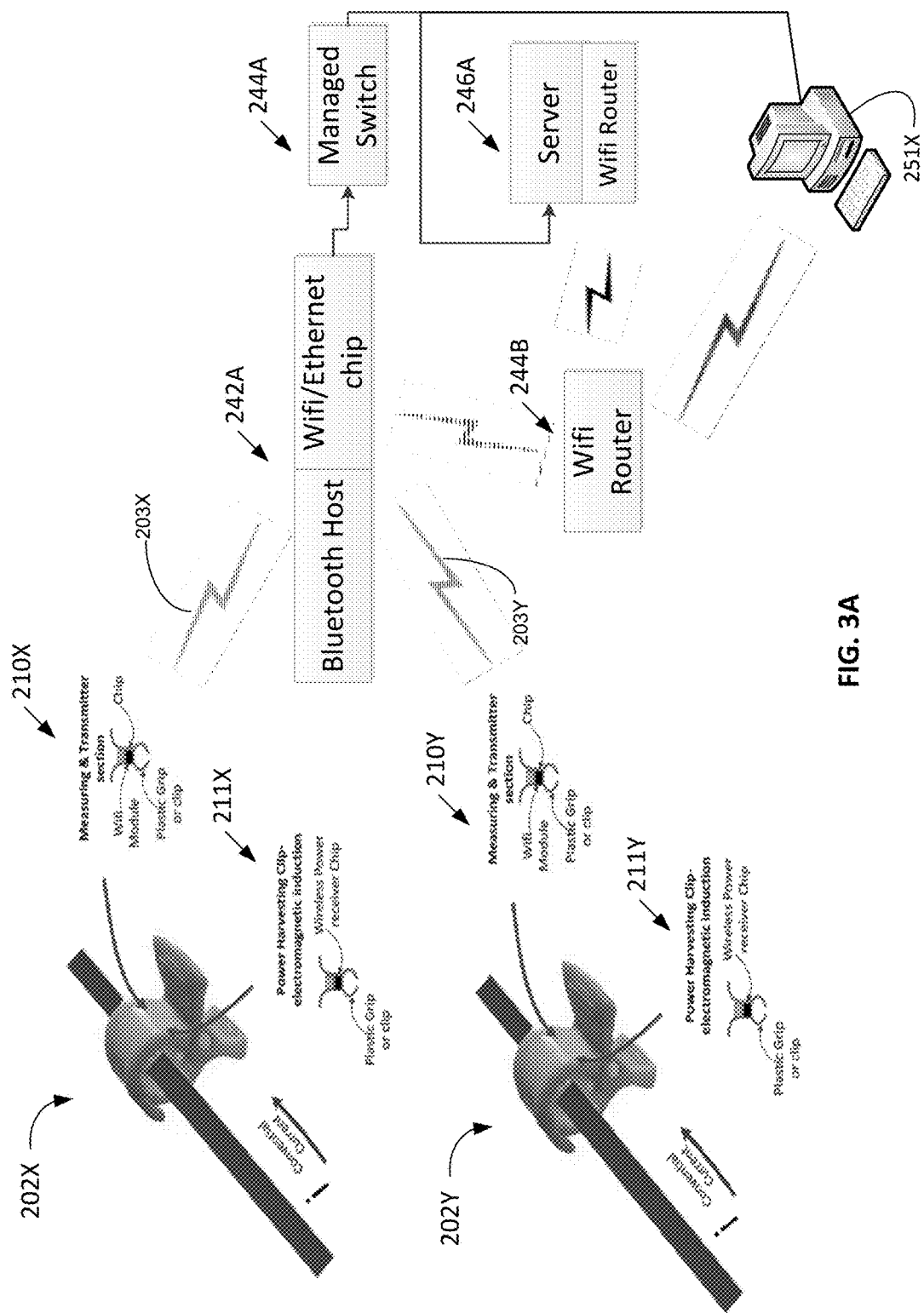
FIG. 3A is a conceptual diagram illustrating various communication devices and systems of FIG. 3 according to various examples described herein.

FIG. 3A is a conceptual diagram illustrating various details of communication devices and systems of FIG. 3 according to various examples described herein. As shown in FIG. 3A, a multi-probe system including power monitoring probes 202X and 202Y is illustrated with respect to an examples communications system of FIG. 3. Probes 202X and 202Y may be examples of any of the power monitoring probes described throughout this disclosure, including probe 202 as shown in FIG. 3, and may provide some or all of the features and functions described with respect to any of these power monitoring probes. In FIG. 3A, each of probes 202X and 202Y include a measuring and transmission section 210X, 210Y, respectively. The measurement and transmission sections 210X and 210Y are configured to provide any of the measurement and wireless communication functions described through this disclosure, including any of the functions described with respect to section 210A,B as illustrated and described with respect to FIGS. 2H and 2J. As also shown in FIG. 3A each of probes 202X and 202Y include a power harvesting chip 211X and 211Y, respectively, configured to harvest power from the electrical conductor the probes 202X and 202Y are respectively coupled to. The power harvesting chips 211X and 211Y may be configured to perform any of the power harvesting function described throughout this disclosure, including for example the power harvesting functions described with respect to power harvesting chip 210C illustrated and described with respect to FIGS. 2H and 2K.

In various examples illustrated in FIG. 3A, wireless transmission of data 203X from probe 202X and the wireless transmission of data 203Y from probe 202Y are configured to use a WiFi connection communicating via IEEE 802.11 a/b/g/n protocol. In various examples, wireless transmission of data is configured to use Bluethooth® (as specified and managed by the Bluetooth SIG standards and IEEE 802.15.1 when updated, Zigbee®, modified Zigbee® based on the IEEE 802.15.4 protocol. In some examples, Bluetooth® low energy transceiver device will be embedded in the probe structure which will communicate with a host 242A located within 25 to 50 ft. of probes 202X, 202Y. The probe Bluetooth host 242A will communicate to a master host, such as DCIM computer 251X, via WiFi or Ethernet. Communication with the master host 251X may be through a WiFi router 244B as part of a network (e.g., network 244 of FIG. 3), or through managed switch 244A to a server 246A (such as server 246 shown in FIG. 3), wherein server 246A may also communicate though one or more WiFi routers to master host 251X. Master host 251X in various examples is computer device 251 as illustrated and described with respect to FIG. 3, and may provide some or all of the functions and features described above with respect to computer device 251. In some examples, each Bluetooth probe will be configured and/or programmed and given a Branch Circuit name. In various examples the probes communicate to a Zigbee® Gateway. Each probe will be assigned a node number that will communicate and transmit data to the gateway. The Zigbee® gateways will communicate with a master host that will communicate to a server. In various examples, transmission of data is configured to be transmitted through the conductor to which the probe is affixed, for example using powerline carrier methodology.

Referring back to FIG. 3, the types of data and/or information transmitted from probe 202 to external devices 240 is not limited to any particular data, or to any particular types of information, and may include any of the data or information described herein. For example, data transmitted from probe 202 to external device 240 may include data regarding one or more sensed levels of current flowing through electrical conductor 270. In various examples, data transmitted from probe 202 to external devices 240 may include data related to temperatures sensed by probe 202. In various examples, information transmitted from probe 202 to external devices 240 comprises a serial number or some other type of data that identifies the wireless transmission as having been provided by probe 202. This information may be utilized in systems were multiple probes, such as illustrated in system 10 of FIG. 1, are all transmitting data to the external devices 240 at various times, in some examples providing overlapping transmissions from two or more probes during a same time period. The serial numbers or other types of identification data transmitted from the probes allows the external devices 240 to correlate that received data with the probe that provided the data.

In various examples, data transmitted from probe 202 to external devices may include date and time information associated with sensed parameters that are sensed by probe 202. Each probe will have a Bluetooth® device name associate with the branch circuit being monitored. When the device is configured to communicate via WiFi, the device will have a branch circuit identifier name (SIDE). When IEEE 15.4 (Zigbee) or Power Line Carriers is used, the device will have a node addresses.

In various examples, information may be transmitted from external devices 240 to probe 202. Such information includes parameters that control one or more of the sensing functions to be performed by probe 202. For example, information transmitted to probe 202 may include one or more sensing parameters that dictate a rate at which probe 202 is to sample one or more sensed parameters associated with electrical conductor 270, such as a sample rate for sensing current flows, for sensing temperature, and/or for sensing both current and temperature. The probe can be configured via Bluetooth and can be programmed to operate in its desired current range. The circuit name for the probe can be programmed. In addition temperature data can also be set to be transmitted wirelessly from the probe.

As illustrated, probe 202 includes sensor circuitry 210 coupled to a power supply 218. In various examples, power supply 218 is a battery, such as a watch type battery, that is detachably coupled to the sensor circuitry 210, and provides an operating voltage and a source of current for powering sensor circuitry 210. When detachably coupled to sensor circuity 210, power supply 218 is configured to be removed and replaced with a new device equivalent to the removed power supply 218 when the power supply 218 has become electrically discharged and/or is no longer able to provide adequate voltage/power to sensor circuitry 210. In various examples, power supply 218 is a battery configured to provide a voltage level of 4.5 volts as an output voltage to power sensor circuitry 210. In some examples, power supply 218 is not a detachable battery, and is a power source, such as a battery, that is permanently incorporated into probe 202 with a nominal operating lifespan that when expended, is not intended to be replaceable. In various examples, power supply 218 is configured to be a rechargeable device, such as a storage battery, that can be periodically recharged by an external device, such as an inductive charging device (not shown in FIG. 3).

As illustrated, sensor circuitry comprises sensors 212, signal processing 214, transceiver 216, a clock 220, a processor 222, and memory 224. In various examples, each of these blocks is coupled to power supply 218, and receives electrical power from power supply 218 in order to operate and perform the functions provided by that block. In various examples, each of these blocks of sensor circuitry 210 are communicatively coupled to one and other to allow signal, data, and other information to be communicated between these blocks.

In various examples, sensor 212 comprise at least one device operable to sense a current flow, and to provide an output signal representative of that sensed current flow. In various examples, sensors 212 comprises a Hall effect device configured to sense a parameter, such as flux density, associated with a magnetic field, and to provide as an output from the Hall effect device, such as an output voltage, that is indicative of the sensed parameter of the magnetic field. As would be understood by one of ordinary skill in the art, an electrical current passing through an electrical conductor, such as electrical conductor 270, generates a magnetic field that surrounds an area nearby and external to the electrical conductor. The strength of the magnetic field at any given distance from the electrical conductor is determined by the level of current flowing through that portion of the electrical conductor. By placing the Hall effect device adjacent to the electrical conductor at a predetermined distance or within a range of predetermined distances from the electrical conductor, a strength of the magnetic field being provided around the electrical conductor due to current flow through the electrical conductor can be sensed by the Hall effect device. By converting sensed strength of the magnet field to an output voltage signal, the Hall effect device can be configured to provide the output voltage signal having a voltage value that is indicative of the current flowing through the electric conductor. In various examples, sensors 212 of sensor circuitry 210 comprises at least one Hall effect device configured to sense the strength of a magnetic field adjacent to and at a predetermined distance from, or within a range of predetermined distances from, electrical conductor 270, and to provide an output voltage signal indicative of the strength of the magnetic field.

In various examples, sensors 212 includes a temperature sensor. As would be understood by one of ordinary skill in the art, various devices, such as thermistor, are configured to have an electrical characteristic, such as electrical resistance, that varies in some known manner relative to the temperature of the device. As such, these devices can be configured into electric circuits that measure the variations of these electrical parameters as a function of the temperature of the device, and thus provide a signal that can be analyzed to determine a sensed value of a temperature for the device. In various examples, sensors 212 include at least one device configured to provide an output signal that is indicative of a sensed temperature. Sensing temperature at or near an electrical conductor, such as electrical conductor 270, may be important in some system to provide an indication that the electrical conductor is carrying a current load that exceeds the level of current that the electrical conductor is designed for and is rated to carry. These overcurrent conditions can result in the electrical conductor heating up in a process of dissipating the electrical energy as thermal energy. Detection of temperatures that exceed a predetermined temperature threshold in the area of an electrical conductor may be useful in detection of these overcurrent/heating conditions in an electrical conductor.

Signal processing 214 is coupled to sensors 212, and is configured to receive an output signal or output signals provided by sensors 212. The type of signal processing performed by signal processing 214 is not limited to any particular type of signal processing. In some examples, signal processing may include filtering, such as high pass filtering or notch filtering, to remove signals in particular frequency ranges from the received output signal, the removed frequencies that might be considered noise or other types of corruption of the output signal received from sensors 212. In various examples, signal processing may include linearization or other forms of scaling of the output signals provided by sensors 212. For example, a sensor may provide an output voltage signal that is non-linear, such as a logarithmic or an exponential signal, and the signal processing performed by signal processing 214 comprises linearization of these non-linear output signals. In various examples, signal processing includes sampling the output signals provided by sensors 212 at some predetermined sample rate, and determining a value of one or more of the output signals at the times the signal or signals is/are sampled. In various examples, the signal processing performed by signal processing 214 includes analog-to-digital (A/D) conversion of the output signal or signals provided by sensors 212, for example by conversion of an analog voltage output signal into a digital signal.

In some examples, clock 220 provides one or more clock outputs as required for the operation of sensor circuity 210. In some examples, clock 220 comprises a high frequency oscillator that provides a clock output to processor 222 to control the rate of operations performed (clock speed or baud rate) of processor 222. In various examples, clock 220 provides an output corresponding to date and time information that may be associated with a date and time of the sensed signals provided by sensors 212. This date and time information may be stored, in some examples in memory 224, along with data associated with the values of sensed signals provided by sensors 212 so that date and/or time information may be transmitted as part of the wirelessly transmitted data provide by probe 202 to external devices 240.

In various examples, processor 222 is configured to operate on a set of instructions, such as instructions stored in memory 224, that when executed perform one or more of the functions described herein with respect to sensor circuitry 210. For example, processor 222 may be configured to provide one, some, or all of the functions provided by signal processing 214. In various examples, processor 222 executes instructions that control the sampling rate or rates for sampling of the output signals provide by sensors 212. In various examples, processor 222 executes instructions that format and configure data and other information related to the sensed parameters for transmission to external devices 240.

Transceiver 216 in not limited to any particular type of wireless transceiver, and may be configured to transmit data and/or other information in a wireless format to external devices 240. In various examples, transceiver 216 is configured to receive data and other information stored in memory 224 and/or provided by processor 222, and to wirelessly transmit the data and/or information to external devices 240. In various examples, transceiver 216 is configured to receive data and/or other information, including output signals directly from signal processing 214, and to wirelessly transmit the data and/or information to external devices 240.

In various examples, transceiver 216 is configured to receive wireless signals as an input, and to provide the data and/or information included in wireless signal to the devices, such as processor 222, memory 224, clock 220, signal processing 214, and/or sensors 212. In various examples, transceiver 216 is a wireless chip configured to be coupled to the chip 202 and to provide communication between chip 202 and receive 242 using any of the techniques described herein.

External devices 240 are not limited to any particular type of devices, and are not limited to any particular number of devices. In various examples, external devices 240 includes one or more wireless receives 242, configured to receive the wireless transmissions provided from probe 202. Wireless receivers 242 are not limited to any particular type of receiver, and are configured to be a receiver or receivers that is/are capable of receiving the type of wireless signals being transmitted by probe 202. In various examples, receiver 242 is a wireless access point (WA) configured to connect one or more probes to a wired Local Area Network (WLAN). In various examples, wireless receiver 242 is a transceiver, configured to both received wireless transmissions from transceiver 216, and to transmit data and/or other information wirelessly to transceiver 216.

In various examples, receiver 242 is coupled to one or more additional device, which may include a server 246, a database 248, and local computer 250, a global computer 251, a mobile device such as smart phone 232, and additional devices 252. As illustrated in FIG. 3. receiver 242 is coupled to network 244, which is configured to communicatively couple receiver 242 to the server 246, to the database 248, to computer 250, and to the additional devices 252. Network 244 is not limited to any particular type of network, and is not limited to providing any particular type of network communication protocol. In some examples, network 244 is (a Local Area Network (LAN) and communicates using one or more of protocols, including but not limited to Ethernet, Fast Ethernet, Local Talk, Token Ring, Fiber Distributed Data Interface (FDDI), and Asynchronous Transfer Mode (ATM).

In various examples, data and other information transmitted from probe 202 and received by receiver 242 is provided to network 244 and to server 246. Server 246 is configured to provide data and other information to database 248 for storage in database 248. In addition, the data and other information may be provided to computer 250. In various examples, computer 250 includes a visual display operable to display the data and/or other information in a visual format on the display. In various examples, computer 250 comprises a processor (not shown in FIG. 3) operable to analyze the data and other information provided by receiver 242. In various examples, analysis performed by computer 250 includes comparing data related to current values provided by probe 202 to one or more threshold current levels, and to provide alarm outputs when the current level exceeds or are other determined to be out of the allowed ranges defined by the one or more threshold current levels. For example, computer 250 may compare the current levels sensed with respect to current flows through electrical conductor 270 to a maximum allowable current threshold value, and if one or more data values representative of a current flowing through electrical conductor 270 exceeds the maximum allowable current threshold value, computer 250 may be configured to generate an overcurrent alarm condition associated with electrical conductor 270. In another example, computer 250 may compare a minimum allowable current threshold value to the current levels sensed with respect to current flows through electrical conductor 270, and if one or more data values representative of a current flowing through electrical conductor 270 is below the minimum allowable current threshold value, computer 250 generates an undercurrent or an open circuit alarm condition associated with electrical conductor 270. Such indications may be useful to detect open circuit conditions, or for example blown fuses or circuit breakers coupled to conductor 270, and thus affecting the current flow through electrical conductor 270.

In various examples, computer 250 operates as a local computer, for example located on site, wherein computer 251 is also connected to network 244 and operates as a global computer, performing some or all of the functions and providing the features as described above with respect to computer 250. In addition, computer 251 may perform various high level functions, such as providing Data Center Infrastructure Management (DCIM) functions. DCIM functions are not limited to any particular functions, and may include optimization of data center performance, track efficiencies and manage power distribution within a data center, and allocate computer resources and power distribution within a system, such as a data center, based on customer demands. In addition, DCIM may also utilize information derived from probes, such as probe 202, and other informant related to system 200, to track and manage billing and usage charged for customers using the system who may be billed for example based on actual usage of the resources provide by system 200.

In various examples, additional devices 252 may include displays, alarms, and/or control devices coupled to network 244. In various examples, displays 254 include one or more visual displays operable to display information about the sensed parameters associated with electrical conductor 270. For example, displays 254 may comprise a graphical visual display configured to display data, for example in the form of a table with numerical values, or for example in the form of a waveform illustrative of the levels of current flows in electrical conductor 270 as sensed by probe 202. In various examples, graphical visual displays 254 are configured to display data, for example in the form of a table with numerical values, or for example in the form of a waveform illustrative of the levels of temperature as sensed by probe 202. In various examples, graphical visual displays included in display 254 are configured to display data related to both current flows and temperatures data sensed by probe 202 and wirelessly transmitted to external devices 240.

Displays 254 are not limited to comprising graphical visual displays, and may comprise other forms of devices that provide a visual indication, such as analog or digital meters, indicator lights, for example light emitting diodes (LEDs) of different colors, and other types of devices configurable to provide a visual representation of some status and/or other data associated with data and/or information wirelessly transmitted from probe 202, or derived by the processing and analysis of the wirelessly transmitted data and/or information.

In various examples, alarms 256 comprise alarm devices, such as visual alarms and/or audio alarms, that when triggered provide an indication of an alarm condition. For example, alarms 256 may comprise one or more indicator lights that are configured to be illuminated when an alarm condition is detected based on the data and/or information provided by probe 202. In other examples, alarms 256 may comprise one or more audio alarms, such as a horn (not shown in FIG. 3), that are configured to be produce an audio output, which can be heard for example by a human operator in the area of the alarm, when an alarm condition is detected based on the data and/or information provided by probe 202. In various examples, alarms 256 may include any combination of visual and audio alarms.

In various examples, control devices 258 includes one or more devices operable to control one or more aspects associated with the electrical system that includes electrical conductor 270, as represented by dashed arrow 260. For example, the one or more of control devices 258 may include an electronic fuse, an electronically triggerable circuit breaker, a relay, or a solid state switch relay (SSR) that can be controlled to switch on and/or switch off a circuit associated with electrical conductor 270. By way of illustration, control devices 258 may comprise a SSR that when switched off, electrically disconnects conductor 270, and any branch circuits coupled to electrical conductor 270, from a power source (not shown in FIG. 3) that normally provides the current flow through electrical conductor 270. In various examples, if a fault condition is detected that may be associated with electrical conductor 270, or for example with a device being powered by a current flow through electrical conductor 270, control devices 258 are configured to disconnect electrical conductor 270 from the power source that is normally intended to provide a flow of current through electrical conductor 270. By disconnecting the power source, further damage to the system that includes electrical conductor 270, or a safety hazard, for example an electrical shock hazard to personnel in the area of the system associated with electrical conductor 270, may be avoided.

As would be understood by one of ordinary skill in the art, the arrangement of devices as shown in FIG. 3 is intended to be illustrative, and many other agreements of these devices, and the number and types of devices included in external device 240 are possible, and are contemplated by the examples of external devices included in system 200. For example, receiver 242 may be coupled directly to computer 250, without being coupled to computer 250 through network 244, and wherein computer 250 is then coupled to network 244 and provides outputs to the network to other external devices 240 related to data and/or other information received from probe 202. In addition, computer 250 may provide the analysis for any and/or all of the additional devices 252. In an alternate example, one or more of addition devices 252 includes logical circuits, and/or processor(s) configured to process the data and/or information received from probe 202, and to determine the settings and the output states associated with the devices included in additional devices 252. In various examples, database 248 is part of computer 250, and comprises memory (not shown in FIG. 3) that is internal to computer 250.

Figure 4:
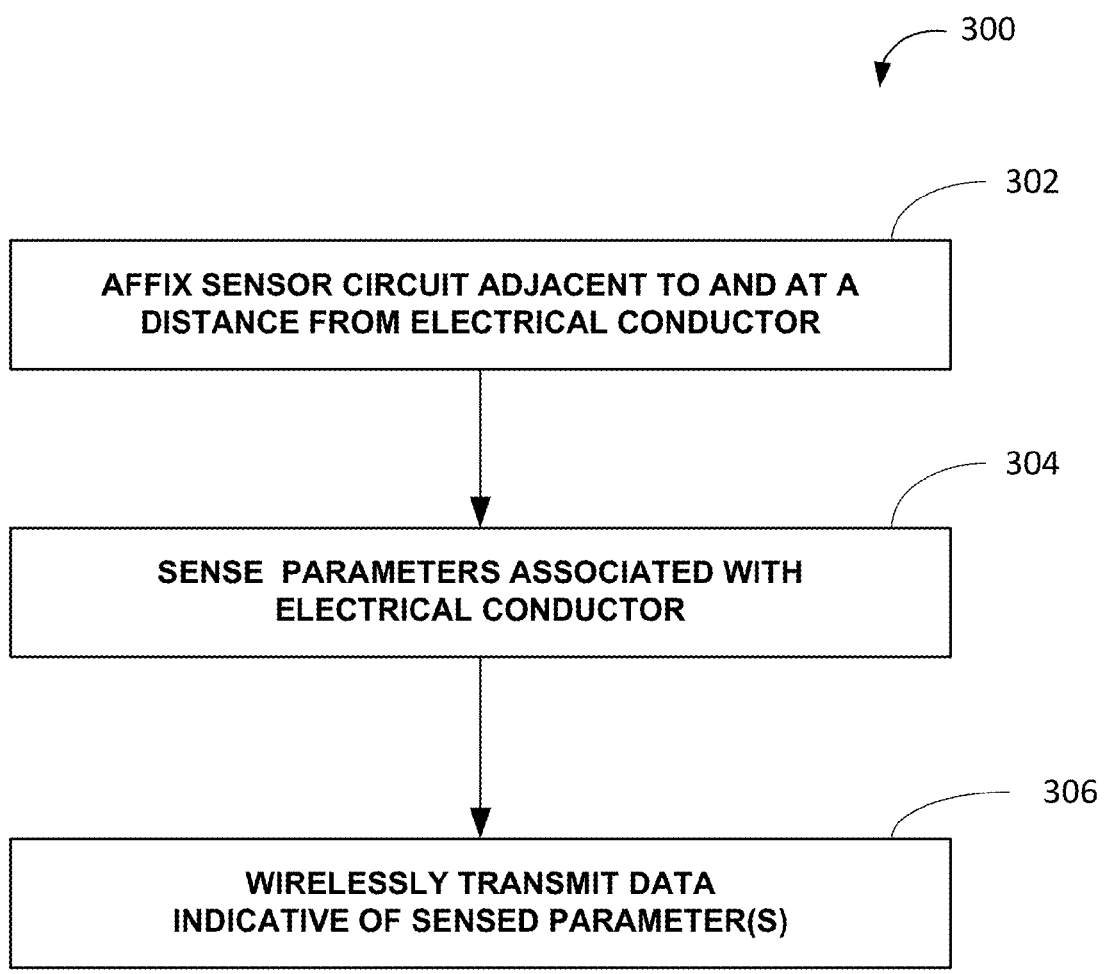
FIG. 4 is a flowchart illustrating a method according to various techniques described herein.

FIG. 4 is a flowchart illustrating a method 300 according to various techniques described herein. Although method 300 is described herein as being performed by probe 100 as illustrated in and described with respect to FIGS. 2A-2D, method 300 is not limited to being performed by probe 100, and may be performed in whole or in part by any of probes 26-32 and 54-61 as illustrated in and as described with respect to FIG. 1, probe 170 as illustrated in and as described with respect to FIG. 2E, probe 180 as illustrated in and as described with respect to FIG. 2F, probe 190 as illustrated in and as described with respect to FIG. 2G, and probe 202 as illustrated in and as described with respect to FIG. 3.

In various examples of method 300, probe 100 comprises attachment of a sensor circuit adjacent to and at a distance from an electrical conductor (block 302). In various examples, attachment of the sensor circuit comprises clipping a clip assembly onto a portion of the electrical conductor such that the portion of the electrical conductor is received in a retention are of the clip assembly, the clip assembly configured to exert a clamping force on the exterior surface of the electrical conductor, and thus secure the clip assembly and the sensor circuit to the electrical conductor. In various examples, attachment of the sensor circuit comprises using an adhesive or an adhesive layer to secure a fastening assembly coupled to the sensor circuit to the electrical conductor. Attachment of the sensor circuit adjacent to the electrical conductor in various examples includes attaching the sensor circuit so that the sensor circuit is located at a predetermined distance from the electrical conductor.

In various examples, method 300 comprises using the sensor circuit of probe 100 to sense one or more parameters associated with the electrical conductor (block 304). In various examples, sensing parameters of the electrical conductor comprises using the sensor circuit to sense a current flow through the electrical conductor. In various examples, the sensor circuit of probe 100 comprises a Hall effect device that is configured to sense a strength of a magnetic field surrounding the electrical conductor, the strength of the magnetic field indicative of a level of current flow through the electrical conductor, and to provide an output signal, for examples a voltage output, in response to the sensed strength of the magnetic field. In various examples, sensing electrical parameters of the electrical conductor comprises using the sensor circuit of probe 100 to sense a temperature at the sensor circuit, and generating an output signal, such as a voltage output, that is indicative of the sensed temperature.

In various examples of method 300, probe 100 is configured to wirelessly transmit data indicative of one or more sensed parameters (306). In various examples, wirelessly transmission of data includes performing one or more signal processing procedures on the output signal or signals received as a result of sensing the parameters associated with the electrical conductor. In various examples, signal processing of the output signal or signals includes filtering of the output signal or signals. In various examples, signal processing of the output signal or signals includes sampling the signal or signals at one or more predetermined sample rates. In various examples, signal processing of the output signal or signals includes analog-to-digital conversion of the output signal or signals from an analog signal into a digital format. In various examples, signal processing of the output signal or signals includes linearization of one or more non-linear output signals.

In various examples, wireless transmission of the data indicative of sensed parameters includes wireless transmission by probe 100 of data indicative of a current flow or current flows over a period of time, or derived parameters from sensed current flows through the electrical conductor. In various examples, wireless transmission of the data indicative of sensed parameters includes wireless transmission by probe 100 of data indicative of a temperature, variations in temperature over a period of time, or derived parameters from sensed temperatures sensed by probe 100. In various examples, wireless transmission of the data indicative of sensed parameters includes wireless transmission by probe 100 of other information, for example date and time information corresponding to when data associated with sensed parameter values was sensed by probe 100. In various examples, wireless transmission of other information includes information indicative of a status of a battery coupled to probe 100 and providing power to operate probe 100.

Figure 5:
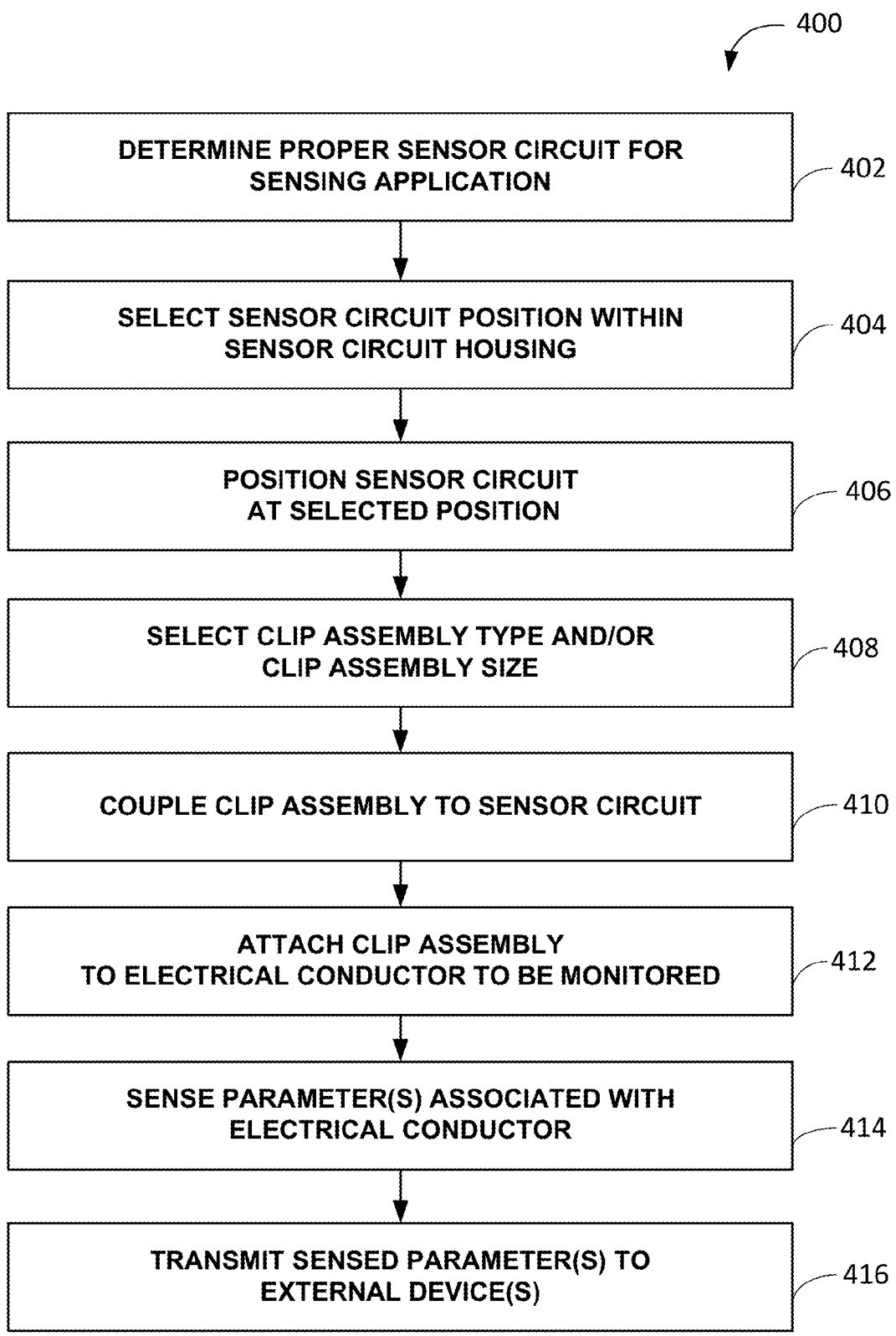
FIG. 5 is a flowchart illustrating a method in accordance with various techniques described herein.

FIG. 5 is a flowchart illustrating a method 400 according to various techniques described herein. Although method 400 is described herein as being performed by or with respect to probe 100 as illustrated in and described with respect to FIGS. 2A-2D, method 400 is not limited to being performed on or by probe 100, and may be performed in whole or in part on or by any of probes 26-32 and 54-61 as illustrated in and as described with respect to FIG. 1, probe 170 as illustrated in and as described with respect to FIG. 2E, probe 180 as illustrated in and as described with respect to FIG. 2F, probe 190 as illustrated in and as described with respect to FIG. 2G, and probe 202 as illustrated in and as described with respect to FIG. 3.

In method 400, a determination is made to select a proper sensing circuit for a sensing application (block 402). In various examples, selection of a proper sensing circuit comprises selection of a sensing circuit configured to sense the one or more particular parameters, such as current flow and/or temperatures. In various examples, selection of a proper sensing circuit comprises selection of a sensing circuit configured to provide wireless transmission of data and/or other information related to sensed parameters using a particular transmission protocol or format. In various examples, the selected format for wireless transmission is a WiFi compatible format of data transmission. In various examples, format for wireless transmission is a format and protocol compliance with the IEEE 802.11 standard.

Various examples of method 400 include selection of one of a plurality of sensor circuit positions within a sensor circuit housing (block 404). In various examples of method 400, the housing of probe 100 is configured to receive the sensor circuit comprises multiple positions that the sensor circuit may be received into, each position placing the sensor circuit at a different distance from an electrical conductor when probe 100 is attached to the electrical conductor. In various example, selection of a sensor circuit position to receive the sensor circuit is determined by a sensitivity parameter associated with the sensor circuit. In examples of probe 100 that include a housing having a plurality of sensor circuit positions, method 400 includes to position the sensor circuit at the selected sensor circuit position within the housing (block 406).

Various examples of method 400 includes selection of a clip assembly type and/or a clip assembly size to be coupled to the housing of probe 100 (block 408). In various examples, selection of the clip assembly type includes selection of the clip assembly type based on a shape of the electrical conductor in the portion of the electrical conductor where the clip assembly is intended to be attached. In some examples, the electrical conductor has substantial a round-shaped cross-sectional dimension at the portion of the electrical conductor where probe 100 is intended to be attached. In other examples, the electrical conductor has a square or a rectangular shape, as for example when the electrical conductor is a bus bar, the square or rectangular shape representative of the cross-sectional dimension of the electrical conductor in the portion of the electrical conductor where probe 100 is intended to be attached. In various examples, the clip assembly is provided in a variety of different sizes, the different sizes comprising one of a range of different size retention areas, each size are configured to attach properly to a certain range of wire gauges and/or or to certain types of electrical conductors, such as insulated versus uninsulated electrical conductors, and wherein different sizes of the clip assemblies would be configured to attach to only a particular range of wire gauges or a particular type of electrical conductor.

In various examples, method 400 includes to couple the clip assembly to the sensor circuit housing. In various examples, selection of the sensor circuit, positioning of the sensor circuit in the housing may be performed either before or after the coupling the clip assembly to the housing (block 410).

In various examples, method 400 includes to secure the clip assembly to an electrical conductor that is to be monitored for one or more parameters associated with the electrical conductor (block 412). In various examples, method 400 includes using probe 100 to sense one or more parameters associated with the electrical conductor (block 414). In various examples, the one or more sensed parameters includes a current flow through the electrical conductor. In various examples, the one or more sensed parameters include a temperature sensed at the probe 100. In various examples, sensing includes calibration of a sensor circuit providing the current sensing by providing a known current flow through the electrical conductor that the clip assembly is affixed to, sensing the know current flow using the sensor circuit, comparing a value of the sensed current flow to the value of the know current flow, determining a calibration adjustment parameter or parameters based on any differences between the value of the sensed current flow and the known current flow, and calibrating the current flow measurements taken by the sensor circuit based on the calibration adjustment parameters. In various examples, method 400 comprises using probe 100 to wirelessly transmit data or other information indicative of the sensed parameters to one or more external devices (block 416). In various examples, transmission of data or other information includes using a WiFi compatible format to transmit the data or other information to the external devices. In various examples, format for wireless transmission is a format and protocol compliance with the IEEE 802.11 standard.

The techniques of this disclosure may be implemented in a wide variety of computing devices, and a wide variety of types of circuits, or any combination thereof. Any of the described units, modules or components and circuits may be implemented together or separately as discrete but interoperable logic devices. Depiction of different features as modules or units is intended to highlight different functional aspects and does not necessarily imply that such modules, circuits, or units must be realized by separate hardware or software components. Rather, functionality associated with one or more modules, circuits, or units may be performed by separate hardware or software components, or integrated within common or separate hardware or software components.

The techniques described in this disclosure may be implemented, at least in part, in hardware, software, firmware or any combination thereof. For example, various aspects of the techniques may be implemented within one or more microprocessors, digital signal processors (DSPs), application specific integrated circuits (ASICs), field programmable gate arrays (FPGAs), or any other equivalent integrated or discrete logic circuitry, as well as any combinations of such components. The terms "processor," "processing circuitry," "controller" or "control module" may generally refer to any of the foregoing logic circuitry, alone or in combination with other logic circuitry, or any other equivalent circuitry, and alone or in combination with other digital or analog circuitry.

For aspects implemented in software, at least some of the functionality ascribed to the systems and devices described in this disclosure may be embodied as instructions on a computer-readable storage medium such as random access memory (RAM), read-only memory (ROM), non-volatile random access memory (NVRAM), electrically erasable programmable read-only memory (EEPROM), FLASH memory, magnetic media, optical media, or the like that is tangible. The computer-readable storage media may be referred to as non-transitory. A server, client computing device, or any other computing device may also contain a more portable removable memory type to enable easy data transfer or offline data analysis. The instructions may be executed to support one or more aspects of the functionality described in this disclosure.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects of the disclosure are provided by the following examples.

EXAMPLE 1

A monitoring probe comprising: a sensor circuit comprising an electrical sensor, the sensor circuit configured to monitor a level of current flow through an electrical conductor when the electrical sensor is affixed adjacent to the electrical sensor, wherein the electrical sensor comprises a sensing element configured to generate an electrical output signal indicative of the level of current flow through the electrical conductor when the electrical sensor is affixed adjacent to the electrical conductor without being electrically coupled to the electrical conductor, a wireless transmission circuit coupled to the electrical sensor, the wireless transmission circuit configured to receive the electrical output signal from the electrical sensor, and to wirelessly transmit data as a wireless output signal from the wireless transmission circuit, the data indicative of the level of current flow through the electrical conductor; and a clip assembly coupled to the electrical sensor, the clip assembly mechanically coupled to the sensor circuit and having a plurality of clip members defining a retention area, wherein the plurality of clip members are configured to receive the electrical conductor within the retention area and exert a force on the conductor therein to affix the electrical sensor at a location adjacent to the electrical conductor.

EXAMPLE 2

The monitoring probe of example 1, wherein the clip members are configured to surround a substantial portion of a circumference around the electrical conductor to affix the clip assembly to the electrical conductor.

EXAMPLE 3

The monitoring probe of any of examples 1-2, wherein the clip members comprise a resilient material configured to allow the clip members to flexibly expand to increase a dimension between an end portion of each clip member to allow the electrical conductor to pass through the dimension between the end portions and into the retention area, and then to flexibly extend toward a circumference of the exterior of the conductor to exert a force on the exterior surface of the electrical conductor to affix the clip assembly to the electrical conductor.

EXAMPLE 4

The monitoring probe of any of examples 1-3, wherein the clip members surround substantial the entirety of the circumference of the exterior surface the electrical conductor when the electrical conductor is fully received in the retention area.

EXAMPLE 5

The monitoring probe of any of examples 1-4, wherein the clip members are coupled to a pair of clip handles and are spring biased around a pivot point relative to one another and configured so that a force applied to the pair of clip handles increases a dimension between end portions of the clip member to allow the electrical conductor to pass through the dimension between the end portions and into the retention area, the clip members further configured so that when the force applied to the clip handles is removed, the spring bias exerts a force on the clip members urging the clip members to substantially surround a circumference of the electrical conductor and to affix the clip assembly to the electrical conductor.

EXAMPLE 6

The monitoring probe of any of examples 1-5, wherein the electrical sensor and the wireless transmission circuit are powered by a battery coupled to the electric sensor circuit.

EXAMPLE 7

The monitoring probe of any of examples 1-6, wherein the sensor circuit comprises a power harvesting circuit configured to capture power from an electromagnetic emission surrounding the electrical conductor and to charge a battery or a super capacitor of the sensor circuit.

EXAMPLE 8

The monitoring probe of any of examples 1-7, wherein the wireless transmission circuit is configured to transmit data by inducing a signal in the electrical conductor being monitored by the electrical sensor circuit.

EXAMPLE 9

The monitoring probe of any of examples 1-8, wherein the clip members include a semi-round shaped resilient member dimensioned to allow the semi-round shaped resilient member to at least partially encircle an outside diameter of the electrical conductor.

EXAMPLE 10

The monitoring probe of any of examples 1-9, wherein the clip assembly comprises a plurality of sensor retaining positions, each sensor retaining position configure to mechanically retain the sensor circuit within the clip, and to position the sensor circuit at a predetermined distance from the electrical conductor, wherein each of the predetermined distances is a different distance from the electrical conductor relative to each of the other predetermined distances.

EXAMPLE 11

The monitoring probe of any of examples 1-10, wherein the electrical sensor circuit further comprises a temperature sensor configured to sense a temperate.

EXAMPLE 12

A probe clip assembly comprising: a first clip member; a second clip member coupled to the first clip member; the first clip member and the second clip member configured to partially enclose a retention area configured to receive a portion of an electrical conductor, the first clip member and the second clip member configured to at least partially surround the portion of the electrical conductor when the electrical conductor is fully received in the retention area, and to exert a force the portion of the electrical conductor received in the retention area in a manner that affixes the probe clip assembly to the electrical conductor; and a housing coupled to the first clip member and the second clip member, the housing configured to receive a sensor circuit and to position the sensor circuit at a location adjacent to the electrical conductor when the electrical conductor is received in the retention area and the probe clip assembly is affixed to the electrical conductor, the sensor circuit configured to monitor one or more parameters associated with the electrical conductor, and to wireless transmit data associated with the one or more parameters.

EXAMPLE 13

The probe clip assembly of example 12, wherein the clip members comprise a resilient material configured to allow the clip members to flexibly expand to increase a dimension between an end portion of each clip member to allow the electrical conductor to pass through the dimension between the end portions and into the retention area, and then to flexibly extend toward a circumference of the exterior of the conductor to exert a force on the exterior surface of the electrical conductor to affix the clip assembly to the electrical conductor.

EXAMPLE 14

The probe clip assembly of any of examples 12-13, wherein the clip members are coupled to a pair of clip handles and are spring biased around a pivot point relative to one another and configured so that a force applied to the pair of clip handles increases a dimension between end portions of the clip member to allow the electrical conductor to pass through the dimension between the end portions and into the retention area, the clip members further configured so that when the force applied to the clip handles is removed, the spring bias exerts a force on the clip members urging the clip members to substantially surround a circumference of the electrical conductor and to affix the clip assembly to the electrical conductor.

EXAMPLE 15

The probe clip assembly of any of examples 12-14, wherein the first clip member and the second clip member are configured at least partially surround the portion of the electrical conductor and to affix the probe clip assembly to electrical conductors having a range of sizes, and wherein the probe clip assembly is provided in a plurality of size configuration, each of the plurality of size configurations configured to accept a range of sizes of electrical conductors that is different range of sizes compared to the range of size another of the plurality of size configurations is configured to accept.

EXAMPLE 16

A kit of parts for forming a monitoring probe comprising: at least one sensing circuit a sensor circuit comprising an electrical sensor and a wireless transmission circuit coupled to the electrical sensor, the sensor circuit configured to monitor a level of current flow through an electrical conductor r, wherein the electrical sensor comprises a sensing element configured to generate an electrical output signal indicative of the level of current flow through the electrical conductor when the electrical sensor is located adjacent to the electrical conductor without being electrically coupled to the electrical conductor, and the wireless transmission circuit configured to receive the electrical output signal from the electrical sensor, and to wirelessly transmit data as a wireless output signal from the wireless transmission circuit, the data indicative of the level of current flow through the electrical conductor; and a plurality of clip assemblies, each of the plurality of clip assemblies configured to be mechanically coupled to the at least one sensor circuit, and wherein each of the plurality of clip assemblies includes a pair of clip members that is configured to receive a size range of electrical conductors in a retention area formed by the clip members, and wherein one or more of the plurality of clip assemblies is confined to receive a size range of electrical conductors that is a different size range than at least one other of the plurality of clip assemblies is configured to receive.

EXAMPLE 17

The kit of parts of example 16, wherein each of the plurality of clip assemblies comprise a different color material, the color of the material corresponding to a size range of electrical conductors that the clip assembly is configured to be affixed to.

EXAMPLE 18

A method comprising: selecting a sensor circuit for a current sensing application; selecting a clip assembly for the current sensing application; coupling, mechanically, the sensor circuit to the clip assembly; coupling the clip assembly mechanically to an electrical conductor, wherein coupling the clip assembly to the electrical conductor comprises coupling the clip assembly so that the sensor circuit is affixed adjacent to and at a predetermined distance from the electrical conductor; sensing, using the sensor circuit, a level of electrical current flowing through the electrical conductor; generating, by the sensor circuit, an electrical output signal indicative of the level of current flowing through the electrical conductor, and wirelessly transmitting, by a wireless transmission circuit, a wireless output signal comprising data, the data indicative of the level of current flow through the electrical conductor.

EXAMPLE 19

The method of example 18, wherein coupling the clip assembly mechanically to the electrical conductor comprises: exerting a force on a pair of spring biased handles pivotally coupled to a pair of clip members forming a retention area of the clip assembly to increase an opening dimension between the clip members; receiving the electrical conductor through the opening dimension and into the retention area; removing the force exerted on the spring biased handles, allowing the spring biasing to urge the clip members toward the electrical conductor and to exert a clamping force against an exterior surface of the electrical conductor in order to affix the clip assembly to the electrical conductor.

EXAMPLE 20

The method of any of examples 18-19, wherein coupling the clip assembly mechanically to the electrical conductor comprises positioning the clip members so that the clip members surround a substantial portion of a circumference around the electrical conductor to affix the clip assembly to the electrical conductor.

EXAMPLE 21

A system comprising: an electrical power distribution system including an electrical power source and a branch circuit comprising a load, a first conductor electrically coupling the branch circuit and the load to the electrical power source through the first conductor, wherein the first conductor is configured to form a portion of an electrical circuit configured to provide a path for a current flow between the load and the electrical power source; a sensor circuit mechanically coupled to the first conductor, the sensor circuit comprising a current sensor circuit and a wireless transmission circuit, the current sensor circuit communicatively coupled to the wireless transmission circuit, the current sensor circuit located adjacent to the first conductor and configured to sense a level of current flowing through the first conductor, and to provide an electrical output signal indicative of the sensed level of current flowing through the first conductor, the wireless transmission circuit configured to receive the electrical output signal from the current sensor circuit and to wirelessly transmit data from the wireless transmission circuit, the data indicative of the level of current flowing through the first conductor.

EXAMPLE 22

The system of example 21, wherein the wireless transmission circuit is configured to transmit data to a receiver coupled to a network, the network comprising a computer configured to perform Data Center Infrastructure Management functions based at least in part on the transmitted data.

Various aspects of this disclosure have been described. These and other aspects are within the scope of the following claims.

What is claimed is:

1. A monitoring probe comprising:
a sensor circuit comprising an electrical sensor, the sensor circuit configured to monitor a level of current flow through an electrical conductor when the electrical sensor is affixed adjacent to the electrical conductor, wherein the electrical sensor comprises a sensing element configured to generate an electrical output signal indicative of the level of current flow through the electrical conductor when the electrical sensor is affixed adjacent to the electrical conductor without being electrically coupled to the electrical conductor,
a wireless transmission circuit coupled to the electrical sensor, the wireless transmission circuit configured to receive the electrical output signal from the electrical sensor, and to wirelessly transmit data as a wireless output signal from the wireless transmission circuit, the data indicative of the level of current flow through the electrical conductor;
a housing comprising a plurality of sensor retaining positions, each sensor retaining position configured to mechanically retain the sensor circuit and the wireless transmission circuit within the housing at a predetermined distance from the electrical conductor when the monitoring probe has received the electrical conductor, wherein each of the predetermined distances is different from each other, and wherein the sensor circuit is installed into one of the plurality of sensor retaining positions to set a sensitivity level of the sensor circuit; and a clip assembly mechanically coupled to the housing, the clip assembly having a plurality of clip members defining a retention area, wherein the plurality of clip members are configured to receive the electrical conductor within the retention area and exert a force on the electrical conductor therein to affix the electrical sensor at a location adjacent to the electrical conductor.

2. The monitoring probe of claim 1, wherein the clip members are configured to surround a substantial portion of a circumference around the electrical conductor to affix the clip assembly to the electrical conductor.

3. The monitoring probe of claim 1, wherein the clip members comprise a resilient material configured to allow the clip members to flexibly expand to increase a dimension between an end portion of each clip member to allow the electrical conductor to pass through the dimension between the end portions and into the retention area, and then to flexibly extend toward a circumference of the exterior of the conductor to exert a force on the exterior surface of the electrical conductor to affix the clip assembly to the electrical conductor.

4. The monitoring probe of claim 3, wherein the clip members surround substantial the entirety of the circumference of the exterior surface the electrical conductor when the electrical conductor is fully received in the retention area.

5. The monitoring probe of claim 1, wherein the clip members are coupled to a pair of clip handles and are spring biased around a pivot point relative to one another and configured so that a force applied to the pair of clip handles increases a dimension between end portions of the clip member to allow the electrical conductor to pass through the dimension between the end portions and into the retention area, the clip members further configured so that when the force applied to the clip handles is removed, the spring bias exerts a force on the clip members urging the clip members to substantially surround a circumference of the electrical conductor and to affix the clip assembly to the electrical conductor.

6. The monitoring probe of claim 1, wherein the electrical sensor and the wireless transmission circuit are powered by a battery coupled to the sensor circuit.

7. The monitoring probe of claim 1, wherein the sensor circuit comprises a power harvesting circuit configured to capture power from an electromagnetic emission surrounding the electrical conductor and to charge a battery or a super capacitor of the sensor circuit.

8. The monitoring probe of claim 1, wherein the wireless transmission circuit is configured to transmit data by inducing a signal in the electrical conductor being monitored by the sensor circuit.

9. The monitoring probe of claim 1, wherein the clip members include a semi-round shaped resilient member dimensioned to allow the semi-round shaped resilient member to at least partially encircle an outside diameter of the electrical conductor.

10. The monitoring probe of claim 1, wherein the sensor circuit further comprises a temperature sensor configured to sense a temperate.

11. A probe clip assembly comprising:
a first clip member;
a second clip member coupled to the first clip member;
the first clip member and the second clip member configured to partially enclose a retention area configured to receive a portion of an electrical conductor, the first clip member and the second clip member configured to at least partially surround the portion of the electrical conductor when the electrical conductor is fully received in the retention area, and to exert a force the portion of the electrical conductor received in the retention area in a manner that affixes the probe clip assembly to the electrical conductor; and
a housing coupled to the first clip member and the second clip member, the housing configured to receive a sensor circuit and to position the sensor circuit at a location adjacent to the electrical conductor when the electrical conductor is received in the retention area and the probe clip assembly is affixed to the electrical conductor, the housing comprising a plurality of sensor retaining positions, each sensor retaining position configured to mechanically retain the sensor circuit and the wireless transmission circuit within the housing at a predetermined distance from the electrical conductor when the monitoring probe has received the electrical conductor, wherein each of the predetermined distances is different from each other, and wherein the sensor circuit is installed into one of the plurality of sensor retaining positions to set a sensitivity level of the sensor circuit, the sensor circuit configured to monitor one or more parameters associated with the electrical conductor, and to wirelessly transmit data associated with the one or more parameters.

12. The probe clip assembly of claim 11, wherein the clip members comprise a resilient material configured to allow the clip members to flexibly expand to increase a dimension between an end portion of each clip member to allow the electrical conductor to pass through the dimension between the end portions and into the retention area, and then to flexibly extend toward a circumference of the exterior of the conductor to exert a force on the exterior surface of the electrical conductor to affix the clip assembly to the electrical conductor.

13. The probe clip assembly of claim 11, wherein the clip members are coupled to a pair of clip handles and are spring biased around a pivot point relative to one another and configured so that a force applied to the pair of clip handles increases a dimension between end portions of the clip member to allow the electrical conductor to pass through the dimension between the end portions and into the retention area, the clip members further configured so that when the force applied to the clip handles is removed, the spring bias exerts a force on the clip members urging the clip members to substantially surround a circumference of the electrical conductor and to affix the clip assembly to the electrical conductor.

14. The probe clip assembly of claim 11, wherein the first clip member and the second clip member are configured at least partially surround the portion of the electrical conductor and to affix the probe clip assembly to electrical conductors having a range of sizes, and wherein the probe clip assembly is provided in a plurality of size configuration, each of the plurality of size configurations configured to accept a range of sizes of electrical conductors that is different range of sizes compared to the range of size another of the plurality of size configurations is configured to accept.

15. A kit of parts for forming a monitoring probe comprising:
- at least one sensor circuit comprising an electrical sensor and a wireless transmission circuit coupled to the electrical sensor, the sensor circuit configured to monitor a level of current flow through an electrical conductor, wherein the electrical sensor comprises a sensing element configured to generate an electrical output signal indicative of the level of current flow through the electrical conductor when the electrical sensor is located adjacent to the electrical conductor without being electrically coupled to the electrical conductor, and the wireless transmission circuit configured to receive the electrical output signal from the electrical sensor, and to wirelessly transmit data as a wireless output signal from the wireless transmission circuit, the data indicative of the level of current flow through the electrical conductor;
- a housing comprising a plurality of sensor retaining positions, each sensor retaining position configured to mechanically retain the at least one sensor circuit and the wireless transmission circuit within the housing at a predetermined distance from the electrical conductor when the monitoring probe has received the electrical conductor, wherein each of the predetermined distances is different from each other, and wherein the sensor circuit is installed into one of the plurality of sensor retaining positions to set a sensitivity level of the at least one sensor circuit; and
- a plurality of clip assemblies, each of the plurality of clip assemblies configured to be mechanically coupled to the at least one sensor circuit, and wherein each of the plurality of clip assemblies includes a pair of clip members that is configured to receive a size range of electrical conductors in a retention area formed by the clip members, and wherein one or more of the plurality of clip assemblies is confined to receive a size range of electrical conductors that is a different size range than at least one other of the plurality of clip assemblies is configured to receive.

16. The kit of parts of claim 15, wherein each of the plurality of clip assemblies comprise a different color material, the color of the material corresponding to a size range of electrical conductors that the clip assembly is configured to be affixed to.

17. A method comprising:
- coupling, mechanically, a sensor circuit to a clip assembly, the clip assembly comprising a housing, the housing comprising a plurality of sensor retaining positions, each sensor retaining position configured to mechanically retain the sensor circuit within the housing at a predetermined distance from an electrical conductor when the clip assembly is affixed to the electrical conductor, wherein each of the predetermined distances is different from each other, the coupling comprising installing the sensor circuit into one of the plurality of sensor retaining position of the housing to set a sensitivity level of the sensor circuit;
- coupling the clip assembly mechanically to the electrical conductor, wherein coupling the clip assembly to the electrical conductor comprises coupling the clip assembly so that the sensor circuit is affixed adjacent to and at a predetermined distance from the electrical conductor;
- sensing, using the sensor circuit, a level of electrical current flowing through the electrical conductor;
- generating, by the sensor circuit, an electrical output signal indicative of the level of current flowing through the electrical conductor, and
- wirelessly transmitting, by a wireless transmission circuit, a wireless output signal comprising data, the data indicative of the level of current flow through the electrical conductor.

18. The method of claim 17, wherein coupling the clip assembly mechanically to the electrical conductor comprises:
- exerting a force on a pair of spring biased handles pivotally coupled to a pair of clip members forming a retention area of the clip assembly to increase an opening dimension between the clip members;
- receiving the electrical conductor through the opening dimension and into the retention area;
- removing the force exerted on the spring biased handles, allowing the spring biasing to urge the clip members toward the electrical conductor and to exert a clamping force against an exterior surface of the electrical conductor in order to affix the clip assembly to the electrical conductor.

19. The method of claim 17, wherein coupling the clip assembly mechanically to the electrical conductor comprises positioning clip members forming a retention area of the clip assembly so that the clip members surround a portion of a circumference around the electrical conductor to affix the clip assembly to the electrical conductor.

20. A system comprising:
- an electrical power distribution system including an electrical power source and a branch circuit comprising a load,
- a first conductor electrically coupling the branch circuit and the load to the electrical power source through the first conductor, wherein the first conductor is configured to form a portion of an electrical circuit configured to provide a path for a current flow between the load and the electrical power source;
- a sensor circuit mechanically coupled to the first conductor, the sensor circuit comprising a current sensor circuit and a wireless transmission circuit, the current sensor circuit communicatively coupled to the wireless transmission circuit, the current sensor circuit located adjacent to the first conductor and configured to sense a level of current flowing through the first conductor, and to provide an electrical output signal indicative of the sensed level of current flowing through the first conductor;
- a housing comprising a plurality of sensor retaining positions, each sensor retaining position configured to mechanically retain the sensor circuit and the wireless transmission circuit within the housing at a predetermined distance from the first conductor when the monitoring probe has received the first conductor, wherein each of the predetermined distances is different from each other, and wherein the sensor circuit is installed into one of the plurality of sensor retaining positions to set a sensitivity level of the sensor circuit,
- the wireless transmission circuit configured to receive the electrical output signal from the current sensor circuit and to wirelessly transmit data from the wireless transmission circuit, the data indicative of the level of current flowing through the first conductor.

21. The system of claim 20, wherein the wireless transmission circuit is configured to transmit data to a receiver coupled to a network, the network comprising a computer configured to perform Data Center Infrastructure Management functions based at least in part on the transmitted data.

\* \* \* \* \*